US011721397B2

(12) United States Patent
Wu et al.

(10) Patent No.: US 11,721,397 B2
(45) Date of Patent: Aug. 8, 2023

(54) POWER SAVING AND FAST READ SEQUENCE FOR NON-VOLATILE MEMORY

(71) Applicant: SanDisk Technologies LLC, Addison, TX (US)

(72) Inventors: Jianzhi Wu, Santa Clara, CA (US); Jia Li, San Francisco, CA (US); Yanjie Wang, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/135,071

(22) Filed: Dec. 28, 2020

(65) Prior Publication Data

US 2022/0208276 A1   Jun. 30, 2022

(51) Int. Cl.
| | |
|---|---|
| *G11C 16/04* | (2006.01) |
| *G11C 16/26* | (2006.01) |
| *G11C 11/56* | (2006.01) |
| *G11C 16/08* | (2006.01) |

(52) U.S. Cl.
CPC .......... *G11C 16/26* (2013.01); *G11C 11/5642* (2013.01); *G11C 16/0483* (2013.01); *G11C 16/08* (2013.01); *G11C 11/5671* (2013.01)

(58) Field of Classification Search
CPC . G11C 16/26; G11C 11/5642; G11C 16/0483; G11C 16/08; G11C 11/5671
USPC .................................................... 365/185.12
See application file for complete search history.

(56) References Cited

U.S. PATENT DOCUMENTS

| | | | |
|---|---|---|---|
| 6,366,501 B1 | 4/2002 | Thurgate et al. | |
| 7,046,568 B2 | 5/2006 | Cernea | |
| 8,098,526 B2 | 1/2012 | Mokhlesi | |
| 8,310,876 B2 | 11/2012 | Yoo et al. | |
| 8,316,177 B2 | 11/2012 | Conley | |
| 8,542,529 B2 | 9/2013 | Li et al. | |
| 10,121,536 B2 * | 11/2018 | Wang | G06F 3/0659 |
| 10,460,814 B2 | 10/2019 | Dak et al. | |
| 2008/0111177 A1 | 5/2008 | Maayan et al. | |
| 2009/0154239 A1 * | 6/2009 | Honma | G11C 16/0483 365/185.03 |
| 2011/0205805 A1 * | 8/2011 | Honma | G11C 11/5628 365/185.22 |
| 2017/0069394 A1 * | 3/2017 | Maejima | G11C 16/26 |

(Continued)

*Primary Examiner* — Tha-O H Bui
(74) *Attorney, Agent, or Firm* — Dickinson Wright PLLC; Steven C. Hurles

(57) ABSTRACT

A memory apparatus and method of operation are provided. The apparatus includes a page of memory cells connected to a plurality of word lines and arranged in strings and configured to retain a threshold voltage. A control circuit couples to the word lines and strings and identifies the memory cells having the threshold voltage less than a primary demarcation threshold voltage of a series for demarcating between memory states in a page read. The control circuit also identifies the memory cells having the threshold voltage less than a secondary demarcation threshold voltage of the series. The control circuit supplies a near zero voltage to the strings of the memory cells identified as having the threshold voltages less than at least one of the primary and secondary demarcation threshold voltages to inhibit conduction currents while identifying the memory cells having the threshold voltage less than a tertiary demarcation threshold voltage.

17 Claims, 18 Drawing Sheets

(56) References Cited

U.S. PATENT DOCUMENTS

2020/0211655 A1* 7/2020 Shibata ................ G06F 3/0604
2021/0082499 A1* 3/2021 Date ................... G11C 11/5628

* cited by examiner

FIG. 7A

TABLE 1

| | Er | A | B | C | D | E | F | G |
|---|---|---|---|---|---|---|---|---|
| LP | 1 | 0 | 0 | 0 | 0 | 1 | 1 | 1 |
| MP | 1 | 1 | 1 | 0 | 1 | 1 | 0 | 0 |
| UP | 1 | 1 | 0 | 0 | 0 | 0 | 0 | 1 |

FIG. 7B

STATE OF CELLS DURING DIFFERENT READS IN 2-3-2 READ

| READ PAGE | READ LEVEL | Er | A | B | C | D | E | F | G | REDUCTION OF ADDITIONAL MEMORY STATES |
|---|---|---|---|---|---|---|---|---|---|---|
| LP | AR | C | NC | NC | NC | NC | NC | NC | NC | - |
| LP | ER | IC | C | C | C | C | NC | NC | NC | - |
| MP | BR | EIC | C | NC | NC | NC | NC | NC | NC | 1/2 |
| MP | DR | IC | IC | C | C | NC | NC | NC | NC | - |
| MP | FR | IC | IC | C | IC | EIC | C | NC | NC | 1/2 |
| UP | CR | EIC | EIC | C | EIC | NC | NC | C | NC | 2/3 |
| UP | GR | IC | IC | EIC | EIC | EIC | EIC | C | NC | 3/4 |

FIG. 9A

| TABLE 2 | Er | A | B | C | D | E | F | G |
|---|---|---|---|---|---|---|---|---|
| LP | 1 | 1 | 1 | 1 | 0 | 0 | 0 | 0 |
| MP | 1 | 0 | 0 | 1 | 1 | 1 | 0 | 0 |
| UP | 1 | 1 | 0 | 0 | 0 | 1 | 1 | 0 |

FIG. 9B

| READ PAGE | READ LEVEL | STATE OF CELLS DURING DIFFERENT READS IN 1-3-3 READ | | | | | | | | REDUCTION OF ADDITIONAL MEMORY STATES |
|---|---|---|---|---|---|---|---|---|---|---|
| | | Er | A | B | C | D | E | F | G | |
| LP | DR | C | C | C | C | NC | NC | NC | NC | 0 |
| MP | AR | C | NC | NC | NC | NC | NC | NC | NC | 0 |
| | CR | IC | C | C | NC | C | NC | NC | NC | 0 |
| | FR | IC | IC | IC | EIC | NC | C | NC | NC | 1/3 |
| UP | BR | EIC | C | NC | NC | NC | NC | NC | NC | 1/2 |
| | ER | IC | IC | EIC | EIC | C | NC | NC | NC | 2/3 |
| | GR | IC | IC | IC | IC | IC | EIC | C | NC | 1/2 |

FIG. 12

| PAGE | NORMAL READ | REVERSE READ |
|---|---|---|
| LP | A→R | E→A |
| MP | B→D→R | F→D→B |
| UP | C→G | G→C |

FIG. 13

| clk | NORMAL | REVERSE |
|---|---|---|
| R | 25us | 25us - 5us |
| RWL | 15us | 15us |

POWER SAVING AND FAST READ SEQUENCE FOR NON-VOLATILE MEMORY

FIELD

This application relates to non-volatile memory apparatuses and the operation of non-volatile memory apparatuses.

BACKGROUND

This section provides background information related to the technology associated with the present disclosure and, as such, is not necessarily prior art.

In order to improve read and program performance of memory devices, multiple charge storage elements or memory transistors in an array are read or programmed in parallel. Thus, a "page" of memory elements are typically read or programmed together. Both reading and verifying operations are performed by executing one or more sensing cycles in which the conduction current or threshold voltage of each memory cell of the page is determined relative to a demarcation value. In general, if the memory is partitioned into n states, there will be at least n–1 sensing passes or levels to resolve all possible memory states. In many implementations, each sensing cycle may also involve two or more passes or levels.

Power consumption is one important consideration of memory devices. With massively parallel sensing, the number of memory cells with conduction current flow will compound. Therefore, there is a need for high performance and high capacity non-volatile memory apparatuses with reduced power consumption during sensing operations.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide an apparatus including a page of memory cells. Each of the memory cells is connected to one of a plurality of word lines. The memory cells are also arranged in one or more strings and are configured to retain a threshold voltage corresponding to one of a plurality of memory states. A control circuit is coupled to the plurality of word lines and the one or more strings. The control circuit is configured to identify the memory cells having the threshold voltage less than a primary demarcation threshold voltage of a series of a plurality of demarcation threshold voltages for demarcating between the plurality of memory states in a page read discerning a page bits of the page of the memory cells. The control circuit is also configured to identify the memory cells having the threshold voltage less than a secondary demarcation threshold voltage of the series. The control circuit supplies a near zero voltage to the one or more strings of the memory cells identified as having the threshold voltage less than at least one of the primary and secondary demarcation threshold voltages in the page read to inhibit conduction currents while identifying the memory cells having the threshold voltage less than a tertiary demarcation threshold voltage of the series.

According to another aspect of the disclosure, a controller in communication with a memory apparatus including a page of memory cells is also provided. Each of the memory cells is connected to one of a plurality of word lines. The memory cells are arranged in one or more strings and are configured to retain a threshold voltage corresponding to one of a plurality of memory states. The controller is configured to identify the memory cells having the threshold voltage less than a primary demarcation threshold voltage of a series of a plurality of demarcation threshold voltages for demarcating between the plurality of memory states in a page read discerning a page bits of the page of the memory cells. The controller is also configured to identify the memory cells having the threshold voltage less than a secondary demarcation threshold voltage of the series. The controller instructs the memory apparatus to supply a near zero voltage to the one or more strings of the memory cells identified as having the threshold voltage less than at least one of the primary and secondary demarcation threshold voltages in the page read to inhibit conduction currents while identifying the memory cells having the threshold voltage less than a tertiary demarcation threshold voltage of the series.

According to an additional aspect of the disclosure a method of operating a memory apparatus is provided. The memory apparatus includes a page of memory cells. Each of the memory cells is connected to one of a plurality of word lines. The memory cells are arranged in one or more strings and are configured to retain a threshold voltage corresponding to one of a plurality of memory states. The method includes the step of identifying the memory cells having the threshold voltage less than a primary demarcation threshold voltage of a series of a plurality of demarcation threshold voltages for demarcating between the plurality of memory states in a page read discerning a page bits of the page of the memory cells. The method continues with the step of identifying the memory cells having the threshold voltage less than a secondary demarcation threshold voltage of the series. The method also includes the step of supplying a near zero voltage to the one or more strings of the memory cells identified as having the threshold voltage less than at least one of the primary and secondary demarcation threshold voltages in the page read to inhibit conduction currents while identifying the memory cells having the threshold voltage less than a tertiary demarcation threshold voltage of the series.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 7A is a schematic read level chart illustrating one embodiment of a read operation utilizing the method of FIG. 6 according to aspects of the disclosure;

FIG. 7B is a chart illustrating one embodiment of locking out or inhibiting conducting cells during a read level during a read operation following a read scheme of read level chart of FIG. 7A according to aspects of the disclosure;

FIG. 9A is a schematic read level chart illustrating one embodiment of a read operation discerning the Gray code of FIG. 8 according to aspects of the disclosure;

FIG. 9B is a chart illustrating one embodiment of locking out or inhibiting conducting cells during a read level during a read operation following a read scheme of read level chart of FIG. 9A according to aspects of the disclosure;

FIG. 12 is a table illustrating sequences or series of the data states being sensed for each of a lower page, middle page, and upper page for both the normal read and the reverse read according to aspects of the disclosure;

FIG. 13 is a table illustrating example timing of a first verify stage and a second program-verify stage according to aspects of the disclosure;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
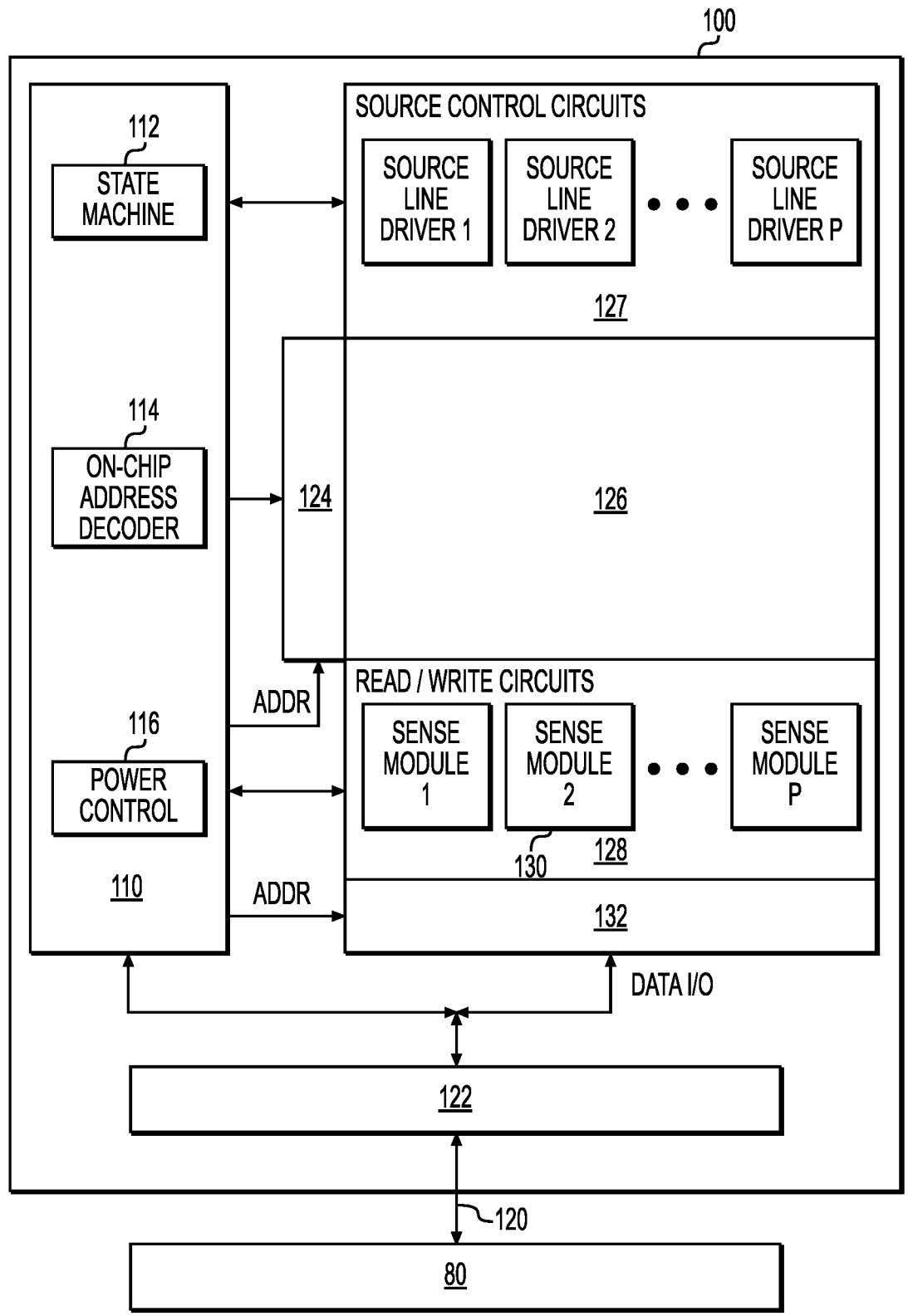
FIG. 1 is a schematic diagram illustrating one embodiment of a memory device according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side SG transistors (SGD transistors), on a drain-side of the NAND string which is connected to a bit line, and one or more source-side SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge trapping layer.

During a program operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming pulses until the programming is completed. Next, a second word line, WL1, is programmed using one or more programming pulses until the programming is completed, and so forth. A programming pulse may include a set of increasing program voltages which are applied to the word line in respective program loops or program-verify iterations. Verify operations or stages may be performed after each program voltage to determine whether the memory cells have completed programming. When programming is completed for a memory cell, it can be inhibited from further programming while programming continues for other memory cells in subsequent program loops.

Each memory cell may be associated with a data state according to write data in a program command. Based on its data state, a memory cell will either remain in the erased state or be programmed to a programmed data state. For example, in a three bit per cell memory device, there are eight data states including the erased state and the programmed state (see e.g., FIGS. 4 and 8).

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the threshold voltage Vt or Vth of the memory cell exceeds the read voltage. The read voltages are set at levels which are expected to be between the threshold voltage levels of adjacent data states.

The order of the sequence or series of read voltages applied to the word lines while sensing may include a series of read voltages of a normal read; however, a different or adjusted series of read voltages of a reverse read may be utilized instead to improve the speed of the read operation. In more detail, the read voltages for different data states vary in magnitude, with higher magnitude read voltages associated with sensing data states corresponding to higher threshold voltages and lower magnitude read voltages associated with sensing data states corresponding to sensing lower threshold voltages. In the normal read, the series of read voltages become increasing higher in magnitude with each successive data state that is being sensed. And in the reverse read, the adjusted series of read voltages become increasing lower in magnitude with each successive data state that is being sensed. Because, the series of read voltages typically begins with an initial voltage spike and then transitions to a first one of the series of read voltages, the speed of the read operation can be improved by applying the higher magnitude read voltage first, as in the reverse read, so that the voltage transition from the initial voltage spike is reduced.

One advantage of the normal read is that a "lockout" mode can be employed. In the lockout mode, the bit line connected to a string of any memory cells that are sensed as conducting when sensing for a lower data state can be set to zero (0) volts or locked out when sensing for a higher data state (i.e., because the memory cells sensed as conducting with lower read voltages are applied to the corresponding word line will of course also conduct when higher read voltages are applied). Consequently, the current consumed by the memory device or apparatus can be reduced, as no current flows through those strings that are locked out as the higher data states are sensed. However, the lockout mode requires that the next read voltage or level of the series of read voltages to be higher than the current read level, such as in the normal read. So, while the reverse read can improve the speed of the read operation as described above, the lockout mode cannot be used with the reverse read to additionally reduce the current consumption of the memory device or apparatus.

FIG. 1 is a schematic diagram illustrating one embodiment of a memory device 100. Memory device 100 includes a memory array 126 of memory cells, such as a two-dimensional array of memory cells or a three-dimensional array of memory cells. The memory array 126 may include memory cells according to an NAND flash type or NOR flash type architecture. Memory cells in a NAND configuration are accessed as a group and are typically connected in series. A NAND memory array is composed of multiple strings in which each string is composed of multiple memory cells sharing a bit line and accessed as a group. Memory cells in a NOR configuration may be accessed individually. NAND flash and NOR flash memory cells may be configured for long-term storage of information as non-volatile memory retaining information after power on/off cycles. Memory array 126 may also be other types of memory cells programmable to store multiple bits of data per cell as non-volatile memory or volatile memory and may be other types of memory cells in other configurations besides NAND or NOR configurations. Memory device 100 may include multiple dies of memory arrays 126.

Memory array 126 is addressable by word lines via a row decoder 124 and by bit lines via a column decoder 132. Row decoder 124 selects one or more word lines and the column decoder 132 selects one or more bit lines in order to apply appropriate voltages to the respective gates/drains of the addressed memory transistor.

Read/write circuits 128 are provided to read or write (program) the memory states of addressed memory transistors. Read/write circuits 128 include multiple sense modules 130 (sensing circuitry) that allow a page (or other unit) of memory cells to be read or sensed in parallel. Each sense module 130 includes bit line drivers and circuits for sensing.

Control circuitry 110 cooperates with read/write circuits 128 to perform memory operations on memory array 126. Control circuitry 110 may include a state machine 112, an on-chip address decoder 114, and a power control module 116. State machine 112 provides chip-level control of memory operations. On-chip address decoder 114 provides an address interface between a host or a memory controller to the hardware address used by decoders 124 and 132. Power control module 116 controls the power and voltages supplied to the word lines and bit lines during memory operations. Control circuitry 110 may include drivers for word lines, source side select lines (SGS), drain side select lines (SGD), and source lines. Control circuitry 110 is also in communication with source control circuits 127, which includes source line driver circuits used to drive varies voltages on the individual source lines.

Memory device 100 includes a controller 122 which operates with a host 80 through a link 120. Commands and data are transferred between a host and controller 122 via a link 120. Link 120 may be via a connection (e.g., a communication path), such as a bus or a wireless connection.

Memory device 100 may be used as storage memory, a main memory, a cache memory, a backup memory, or a redundant memory. Memory device 100 may be an internal storage drive, such as a notebook hard drive or a desktop hard drive. Memory device 100 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Memory device 100 may take the form of an embedded mass storage device, such as an eSD/eMMC embedded flash drive, embedded in host 80. Memory device 100 may also be any other type of internal storage device, removable storage device, embedded storage device, external storage device, or network storage device.

Memory device 100 may be directly coupled to host 80 or may be indirectly coupled to host 80 via a network. For example, the network may include a data center storage system network, an enterprise storage system network, a storage area network, a cloud storage network, a local area network (LAN), a wide area network (WAN), the Internet, and/or another network.

Instructions may be executed by various components of memory device 100, such as by controller 100, controller circuitry 110, row decoder 124, column decoder 132, read/write circuits 128, source control circuits 127, logic gates, switches, latches, application specific integrated circuits (ASICs), programmable logic controllers, embedded microcontrollers, and other components of memory device 100.

Figure 2:
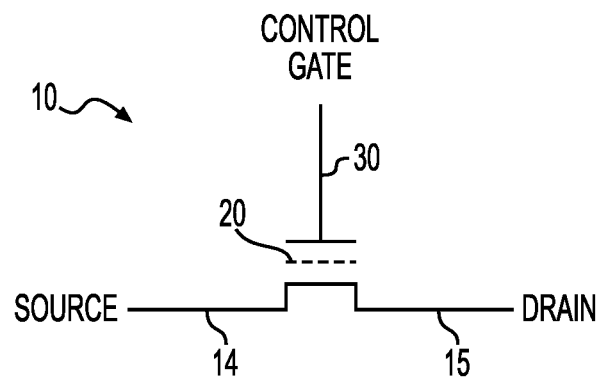
FIG. 2 is a schematic diagram illustrating one embodiment of a flash non-volatile memory cell according to aspects of the disclosure.

FIG. 2 is a schematic diagram illustrating one embodiment of a flash non-volatile memory cell 10. Memory cell 10 can be implemented by a field-effect transistor having a charge storage unit 20, such as a floating gate or a dielectric layer. Memory cell 10 also includes a source 14, a drain 16, and a control gate 30. A memory state of memory cell 10 may be read by sensing the conduction current across the source and drain electrodes of the cell when a reference voltage is applied to the control gate 30. For each given charge on the floating gate of a cell, a corresponding conduction current with respect to a fixed reference control gate voltage may be detected. A range of charge programmable onto the floating gate defines a corresponding threshold voltage window or a corresponding conduction current window of the memory states of memory cell 10.

Figure 3:
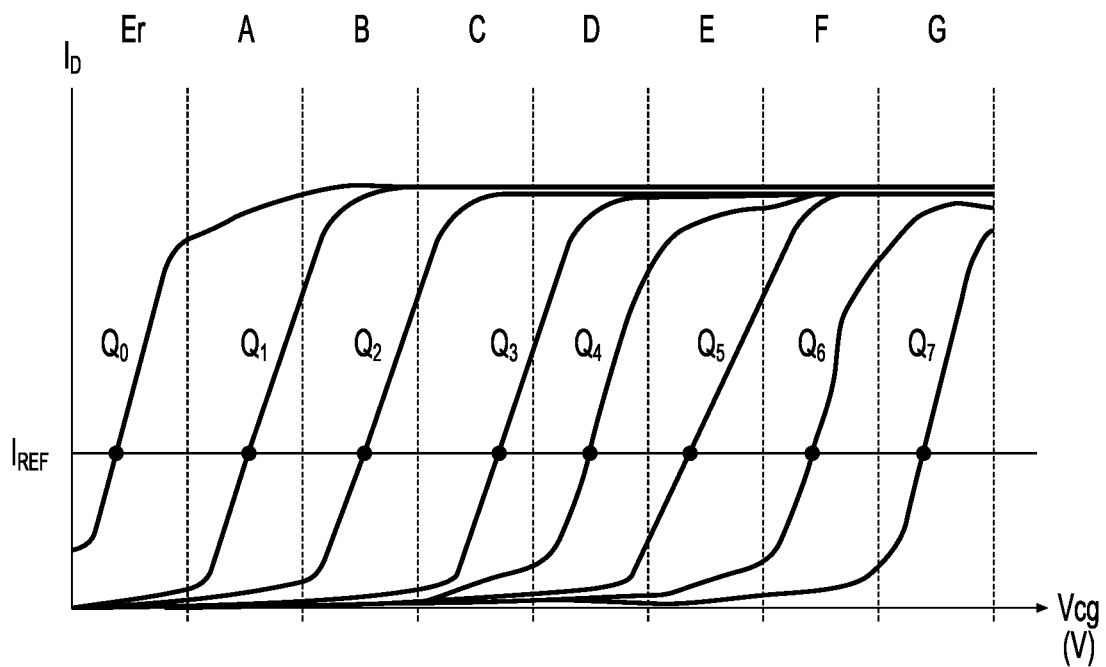
FIG. 3 is a schematic diagram illustrating one embodiment of the relation between a source-drain current and a control gate voltage for eight different charge levels that the floating gate of a memory cell may be selectively storing at any one time according to aspects of the disclosure.

FIG. 3 is a schematic diagram illustrating one embodiment of the relation between a source-drain current ID and a control gate voltage VCG for eight different charge levels Q0-Q7 that the floating gate of a memory cell, such as memory cell 10 of FIG. 2, may be selectively storing at any one time. The eight curves represent eight charge levels on a floating gate of a memory cell corresponding to eight possible memory states. Eight possible memory states representing one erased memory state ER and seven programmed states A, B, C, D, E, F, and G may be demarcated by partitioning the threshold window into eight regions. For example, if a reference current IREF is used, then a cell programmed with a charge level Q1 may be considered to be in an A memory state since its curve intersects with IREF in the region of the A threshold voltage window. If a reference current IREF is used, then a cell programmed with a charge level Q3 may be considered to be in a C memory state since its curve intersects with IREF in the region of the C threshold voltage window.

Figure 4:
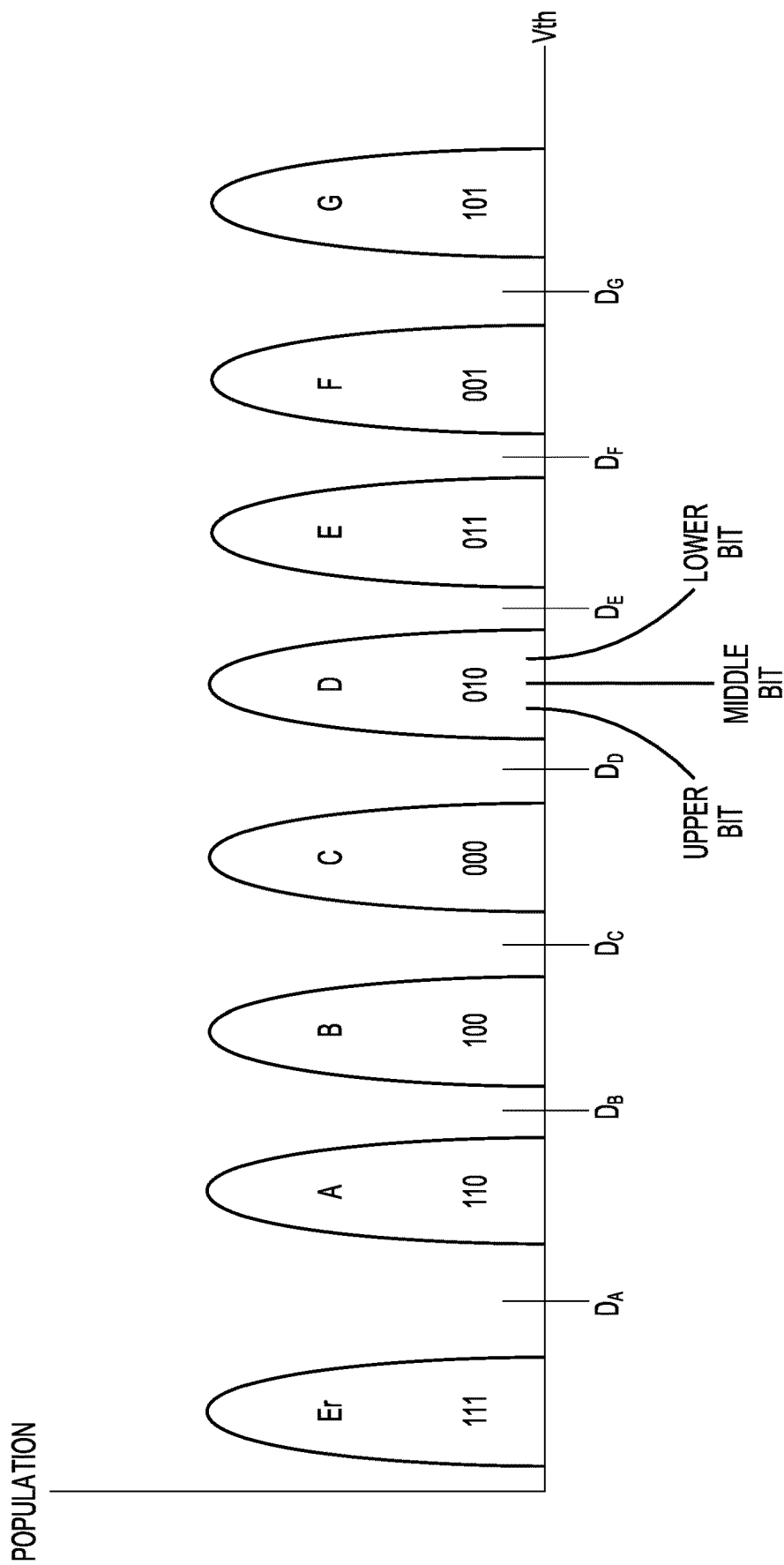
FIG. 4 is a schematic diagram illustrating one embodiment of threshold voltage distributions of a memory array with memory cells operable in eight memory states according to aspects of the disclosure.

FIG. 4 is a schematic diagram illustrating one embodiment of threshold voltage distributions of a memory array with memory cells operable in eight memory states. The possible threshold voltages of each memory cell spans a threshold window which is partitioned into eight regions to demarcate eight possible memory states, "Er", "A", "B", "C", "D", "E", "F" and "G". "Er" is an erased state or a ground state and "A" through "G" are seven progressively programmed states. During a read operation, the eight states may be demarcated by seven demarcation breakpoints of demarcation threshold voltages, $D_A$, $D_B$, $D_C$, $D_D$, $D_E$, $D_F$, and $D_G$.

FIG. 4 also shows one embodiment of 3-bit gray coding represented by the eight possible memory states. Each of the eight memory states represented a triplet of upper, middle, and lower bits. In this embodiment, erased memory state represents "111", A memory state represents "110", B memory state represents "100", C memory state represents "000", D memory state represents "010", E memory state represents "011", F memory state represents "001", and G memory state represents "101." The 3 code bits, "lower", "middle" and "upper" bits, may be read or programmed separately. For example, in a first round, the lower bits of the memory cells may be read. In a second round, the middle bits of the memory cells may be read. In a third round, the upper bits of the memory cells may be read. Similarly in programming, in a first round the lower bits of the memory cells may be programmed and verified. In a second round the middle bits of the memory cells may be programmed and verified. In a third round the upper bits of the memory cells may be programmed and verified.

FIGS. 3 and 4 show a memory cell having eight memory states and operating as a triple-level cell (TLC) or X3 cell storing 3 bits/cell. In other embodiments, a memory cell may have more than eight memory states. For example, a memory cell may have sixteen memory states operating as a quadruple-level memory cell (QLC) or X4 cell storing 4 bits/cell.

Figure 5:
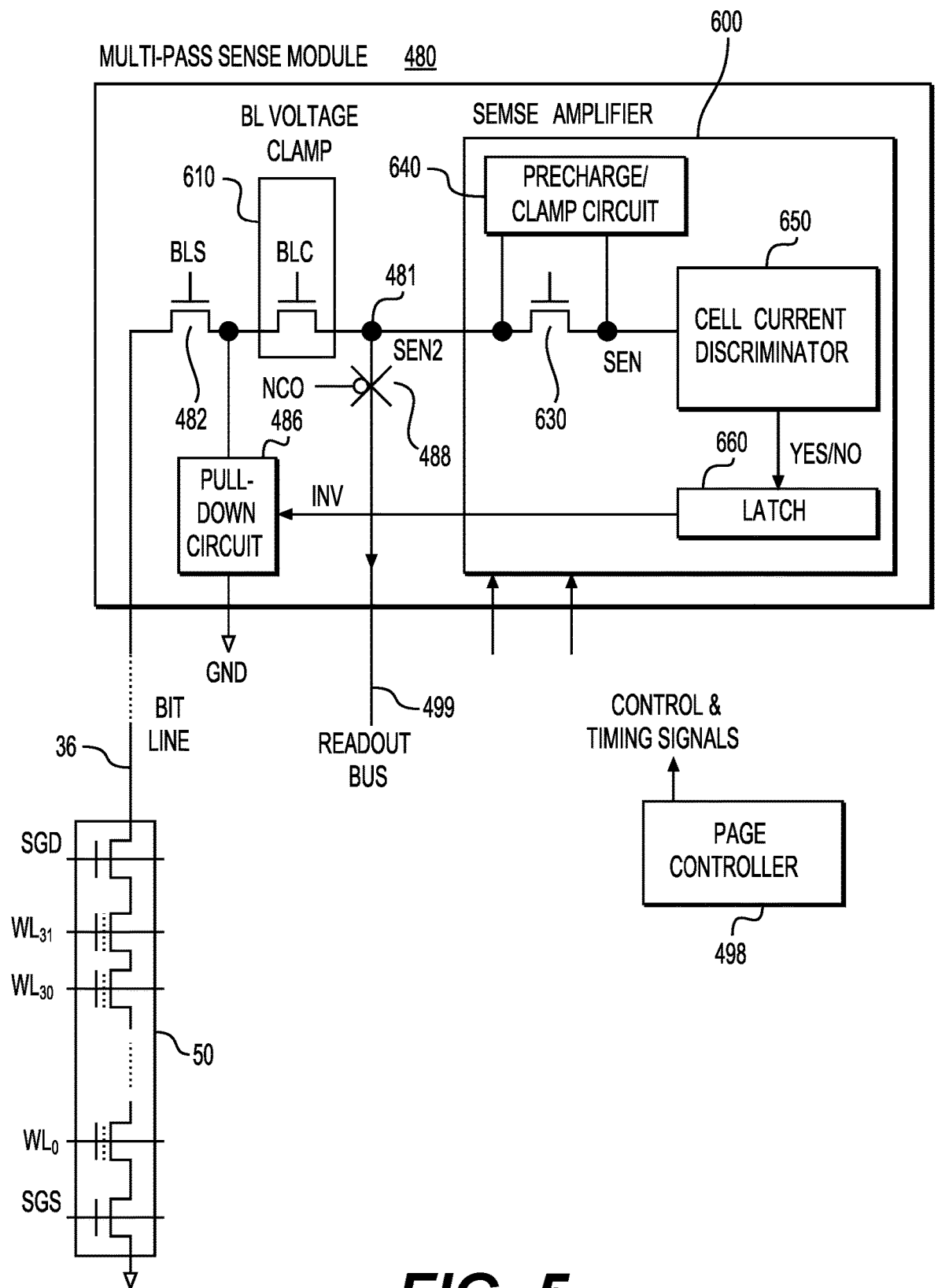
FIG. 5 is a schematic diagram illustrating one embodiment of a sense block for sensing a conduction current of a memory cell for read operations or verify operations according to aspects of the disclosure.

FIG. 5 illustrates schematically in more details a preferred sense module shown as sense module 130 in FIG. 1. The sense module 480 senses the conduction current of a memory cell in a NAND chain 50 via a coupled bit line 36. It has a sense node 481 that can be selectively coupled to a bit line, a sense amplifier 600 or a readout bus 499. Initially, an isolation transistor 482, when enabled by a signal BLS connects the bit line 36 via a bit line voltage clamp 610 (controlled by a signal BLC) to the sense node 481. The sense amplifier 600 senses a signal SEN2 at the sense node 481. The sense amplifier includes a precharge/clamp circuit 640, a cell current discriminator 650 and a latch 660. In this example, the NAND chain 50 has thirty-two memory cells in series with their control gates connected to word lines $WL_0$-$WL_{31}$ respectively. The NAND chain 50 is coupled to ground via a select transistor controlled by a signal SGS and coupled to the bit line 36 via a select transistor controlled by a signal SGD.

The sense module 480 enables the conduction current of the selected memory cell in the NAND chain to be sensed. Prior to sensing, the voltages to the gates of the selected memory cell must be set via the appropriate word lines and bit line. As will be described in more detail later, the precharge operation starts with the unselected word line charging to a voltage Vread followed by charging the selected world line to a predetermined threshold voltage Vt(i) for a given memory state under consideration. Then the precharged circuit 640 brings the bit line voltage to a predetermined drain voltage appropriate for sensing. This will induce a source-drain conduction current to flow in the selected memory cell in the NAND chain 50, which is detected from the channel of the NAND chain via a coupled bit line 36. The conduction current is a function of the charge programmed into the memory cell and the applied Vt(i) when there exists a nominal voltage difference between the source and drain of the memory cell.

When the Vt(i) voltage is stable, the conduction current or the programmed threshold voltage of the selected memory cell can be sensed via the coupled bit line 36. The sense amplifier 600 is then coupled to the sense node to sense the conduction current in the memory cell. The cell current discriminator 650 serves as a discriminator or comparator of current levels. It effectively determines whether the conduction current is higher or lower than a given demarcation current value $I_0(j)$. If it is higher, the latch 660 is set to a predetermined state with the signal INV=1.

A pull-down circuit 486 is activated in response to the latch 660 setting the signal INV to HIGH. This will pull down the sense node 481 and therefore the connected bit line 36 to ground voltage. This will inhibit the conduction current flow in the memory cell 10 (i.e., lock out) irrespective of the control gate voltage since there will be no voltage difference between its source and drain.

According to an aspect, there can be a page of memory cells being operated on by a corresponding number of multi-pass sense modules 480. A page controller 498 supplies control and timing signals to each of the sense modules. The page controller 498 cycles each of the multi-pass sense module 480 through a predetermined number of passes (j=1 to N) and also supplies a predetermined demarcation current value $I_0(j)$ for each pass. As is well known in the arts, the demarcation current value can also be implemented as a demarcation threshold voltage, or time period for sensing. After the last pass, the page controller 498 enables a transfer gate 488 with a signal NCO to read the state of the sense node 481 as sensed data to a readout bus 499. In all, a page of sense data will be read out from all the multi-pass modules 480. Similar sense modules have been disclosed in U.S. Pat. No. 7,046,568 granted May 16, 2006 to Cernea et al., entitled "MEMORY SENSING CIRCUIT AND METHOD FOR LOW VOLTAGE OPERATION". The entire disclosure of U.S. Pat. No. 7,046,568 is herein incorporated by reference.

Figure 6:
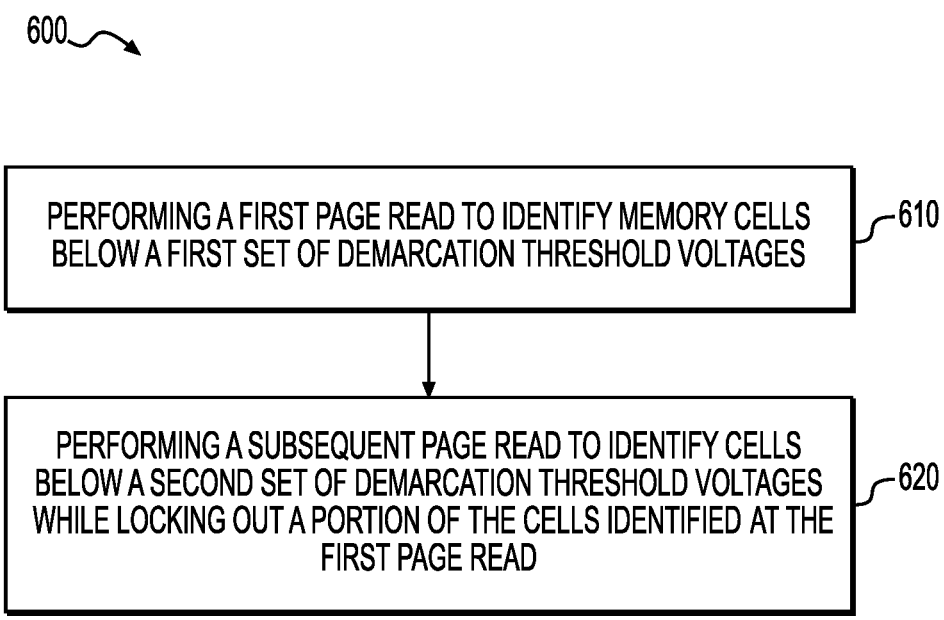
FIG. 6 is a flowchart illustrating one embodiment of a method of sensing the memory states of a memory device according to aspects of the disclosure.

FIG. 6 is a flowchart illustrating one embodiment of a method 600 of sensing a memory state of the memory cells of a memory device, such as memory device 100 of FIG. 1 and sense module 130, 480 of FIG. 1 and FIG. 5, but other memory devices and sense modules are possible.

In process 610, a first page read may be performed. The first page read includes one or more read levels of a first series of one or more demarcation threshold voltages. The first page read identifies memory cells with threshold voltages below the first series of one or more demarcation threshold voltages.

In process 620, a subsequent page read may be performed. The subsequent page read includes one or more read levels of a second series of one or more demarcation threshold voltages. The subsequent page read identifies memory cells with threshold voltages below the second series of one or more demarcation threshold voltages. During the subsequent page read, a portion of the memory cells identified at process 610 are locked out during one or more of the read levels in the subsequent page read. During the subsequent page read, a portion of the memory cells identified in a prior read level in the current page read may also be locked out during subsequent read levels in the current page read.

Peak channel current (Icc) is an important metric for the memory device or apparatus and is defined as the highest Icc level during the given operation. Thus, peak Icc is significant to the power management of the memory device or apparatus. Method 600 may be used to reduce Icc or current consumed by memory array 126 or memory die during read operations. In read operations of more than one page read, memory cells identified in a first page read may be locked out in a subsequent page read to conserve current consumed. Prior page read information alone or in combination with prior read level information in a current page read may be used to lockout additional number of memory cells during a current page read to reduce Icc during a read operation.

FIG. 7A is a read level chart 700 illustrating one embodiment of a read operation utilizing the method 600 of FIG. 6. Read level chart 700 illustrates a read operation discerning the lower bits, middle bits, and upper bits of the 8-state memory encoded with a Gray code of FIG. 4 using a 2-3-2 read scheme. The read scheme includes three pages of reads of a lower page read, a middle page read, and an upper page read. In the lower page read, two demarcation threshold voltages are provided to identify memory cells with two read levels to discern the lower bits. In the middle page read, three demarcation threshold voltages are provides to identify memory cells with three read levels to discern the middle bits. In the upper page read, two demarcation threshold voltages are provides to identify memory cells with two read levels to discern the upper bits. In the read scheme, certain memory cells in certain memory states are locked out during a read level so that power is not drained unnecessarily. Memory cells may be locked out by inhibiting the conductive cells or by having their conduction currents turned off by grounding their bit lines (or connect to SGS transistor source node value if NAND string source is set to non-zero).

FIG. 7B is a table 750 illustrating one embodiment of locking out or inhibiting conducting cells during a read level to reduce Icc during a read operation following a read scheme of read level chart 700 of FIG. 7A. The entry "c" represents non-inhibited conductive cells during a particular read level. The entry "nc" represents non-conductive cells during a particular read level. The entry "ic" represents inhibited conductive cells during a particular read level. These cells are identified based on a prior read level from the same page this is being read. The entry "eic" represents extra or additional inhibited conductive cells during a particular read level in which the extra or additional inhibited conductive cells are identified from a prior read level from a prior page read.

A lower page read comprising a two level read with a first level A read relative to demarcation of $D_A$ and a second level E read relative to demarcation threshold voltage $D_E$, may discern the lower bits of the memory cells. In the first level A read, those memory cells with programmed threshold voltages less than the demarcation threshold voltage $D_A$ are detected. In the second level E read, those memory cells with programmed threshold voltages less than the demarcation threshold voltage $D_E$ are detected. In the second level E read, Erased state memory cells previously identified under A read from the current lower page read may be locked out during E read.

A middle page read comprising a three level read with a first level B read relative to demarcation threshold voltage of $D_B$, a second level D read relative to demarcation threshold voltage $D_D$, and a third level F read relative to demarcation threshold $D_F$ may discern the middle bits of the memory cells. In the first level B read, those memory cells with programmed threshold voltages less than the demarcation threshold voltage $D_B$ are detected. In the first level B read, Erased state memory cells previously identified under A read in the prior lower page read are locked out. In the second level D read, those memory cells with programmed threshold voltages less than the demarcation threshold voltage $D_D$ are detected. In the second level D read, Erased and A state memory cells previously identified under B read in the current middle page may be locked our during D read. In the third level F read, those memory cells with programmed threshold voltages less than the demarcation threshold voltage $D_F$ are detected. In the third level F read, Erased, A, B, C, and D state memory cells previously identified under E read from the prior lower page read may be locked out during F read.

An upper page read comprising a two level read with a first level C read relative to demarcation of $D_C$ and a second level G read relative to demarcation threshold voltage $D_G$ may discern the upper bits. In the first level C read, those memory cells with programmed threshold voltages less than the demarcation threshold voltage D, are detected. In the first level C read, Erased and A state memory cells previously identified under B read from the prior middle page read may be locked out during C read. In the second level G read, those memory cells with programmed threshold voltages less than the demarcation threshold voltage $D_G$ are detected. In the second level G read, Erased, A, B, C, D, and E previously detected under F read from prior middle page read may be locked out.

Locking out additional memory cells identified in a prior read level from a prior page read as compared to only locking out memory cells identified in a prior level from a current page read reduces the number of cells sensed and reduces the Icc or power consumed. Column 760 of table 750 indicates the fraction or percentage of additional memory states locked out using prior read level from a prior page read relative to the remaining conductive memory states identified simply by using a prior read level from a current page read. The additional memory states locked out are identified from a prior read level for a prior page read which could not have been identified from a prior level in a current page read.

For example, in B read in a middle page read, additional Erased state conductive memory cells may be locked out. The additional Erased state memory cells are identified from the prior lower page A read. No additional memory cells could have been identified in the current middle page read without a prior read level or a without a prior dummy read in the current middle page read. In B read, the sense operation is sensing two memory states of conducting Erased and A state memory cells if memory state information is only used from the current middle page read. In B read, the sense operation is sensing one memory state of conducting A state memory cells if Erased state memory cells identified in the prior lower page A read are locked out. Therefore, utilizing memory state information in a prior lower page A read in comparison to a current middle page read results in locking out one additional memory state out of two conducting memory states sensed in the B read.

For example, in F read in a middle page read, additional D state conductive memory cells may be locked out as well as locking out Erased, A, B, and C state conducting memory cells. The additional D state memory cells as well as Erased, A, B, and C state conducting memory cells may be identified from the lower page read E. Erased, A, B, and C state conducting memory cells could have also been identified in the prior level D read of the current middle page read. In F read, the sense operation is sensing two memory states of the conducting D and E state memory cells if only memory cells identified in the prior D level read of the current page read are locked out. In F read, the sense operation is sensing one conducting memory cell state in an E memory state if D state memory cells identified in the prior lower page E read are locked out. Therefore, utilizing memory state information in a prior lower E page read in comparison to a prior D read level in a current middle page read results in locking out one additional memory state out of two conducting memory states sensed in the F read.

For example, in C read in an upper page read, additional Erased and A state conductive memory cells may be locked out. The additional Erased and A state memory cells are identified from the middle page B read. No additional memory cells could have been identified in the current upper page read without a prior read level or without a dummy read in the current upper page read. In C read, the sense operation is sensing three memory states of the conducting Erased, A, and B state memory cells if memory state information is only used from the current upper page read. In C read, the sense operation is sensing one memory state of conducting B state memory cells if Erased and A state memory cells identified in the prior middle page B read level are locked out. Therefore, utilizing information in a prior middle page B read level in comparison to a current upper page read results in locking out two additional memory states out of the three conductive memory states sensed in the C read.

For example, in G read in a upper page read, additional C, D, and E state conductive memory cells may be locked out as well as locking out Erased, A, and B state conducting memory cells. The additional C, D, and E state memory cells as well as Erased, A, and B state conducting memory cells may be identified from the middle page F read. Erased, A, and B state conducting memory cells could have also been identified in the prior level of the current upper page C read. In G read, the sense operation is sensing four memory states of the conducting C, D, E, and F state memory cells if only memory cells identified in the current upper page read are locked out. In G read, the sense operation is sensing one conducting memory cell state in an F memory state if C, D, and E state memory cells identified in the prior middle page F read are additionally locked out. Therefore, utilizing information in a prior middle page F read in comparison to a prior C read level in a current upper page read results in locking out three additional memory states out of four conductive memory states sensed in the G read.

Figure 8:
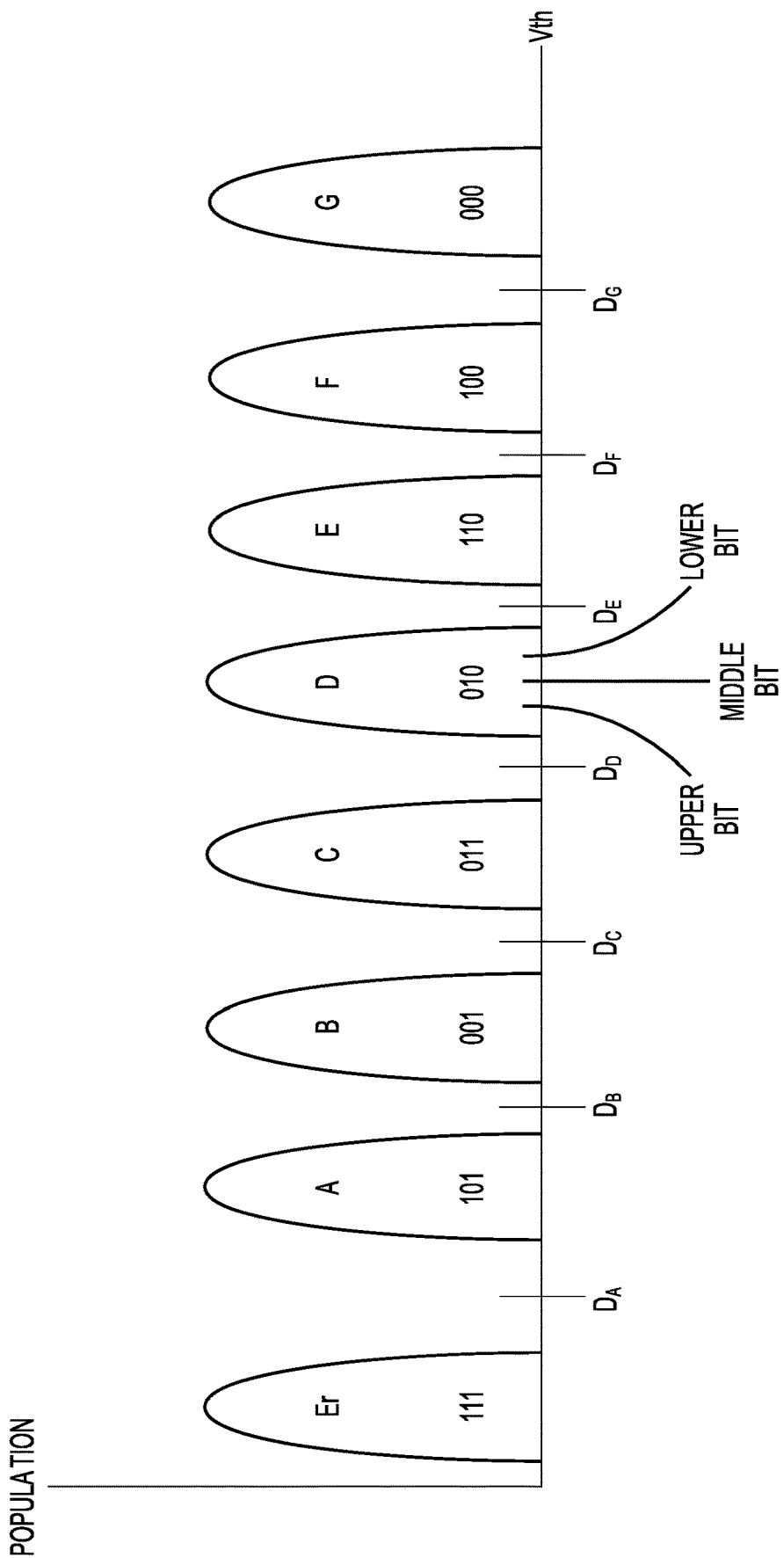
FIG. 8 is a schematic diagram illustrating another embodiment of 3-bit gray coding represented by eight memory states according to aspects of the disclosure.

FIG. 8 is a schematic diagram illustrating another embodiment of 3-bit gray coding represented by the eight memory states. In this embodiment, Erased memory state represents "111", A memory state represents "101", B memory state represents "001", C memory state represents "011", D memory state represents "010", E memory state E represents "110", F memory state represents "100", and G memory state represents "000." The 3 code bits, "lower", "middle" and "upper" bits, may be read or programmed separately. For example, in a first round, the lower bits of the memory cells may be read. In a second round, the middle bits of the memory cells may be read. In a third round, the upper bits of the memory cells may be read. Similarly in programming, in a first round the lower bits of the memory cells may be programmed and verified. In a second round the middle bits of the memory cells may be programmed and verified. In a third round the upper bits of the memory cells may be programmed and verified.

FIG. 9A is a schematic read level chart 900 illustrating one embodiment of a read operation utilizing the method 600 of FIG. 6. Read level chart 900 illustrates a read operation discerning the lower bits, middle bits, and upper bits of the 8-state memory encoded with a Gray code of FIG. 8 using a 1-3-3 read scheme. The read scheme includes three pages of reads of a lower page read, a middle page read, and an upper page read. In the lower page read, one demarcation threshold voltage is provided to identify memory cells with one read level to discern the lower bits. In the middle page read, three demarcation threshold voltages are provides to identify memory cells with three read levels to discern the middle bits. In the upper page read, three demarcation threshold voltages are provides to identify memory cells with three read levels to discern the upper bits. In the read scheme, certain memory cells in certain memory states are locked out during a read level so that power is not drained unnecessarily. Memory cells may be locked out by inhibiting the conductive cells or by having their conduction currents turned off by grounding their bit lines.

FIG. 9B is a table 750 illustrating one embodiment of locking out or inhibiting conducting cells during a read level to reduce ICC during a read operation following a read scheme of read level chart 900 of FIG. 9A. The entry "c" represents non-inhibited conductive cells during a particular read level. The entry "nc" represents non-conductive cells during a particular read level. The entry "ic" represents inhibited conductive cells during a particular read level. The entry "eic" represents extra or additional inhibited conductive cells during a particular read level in which the extra or additional inhibited conductive cells are identified from a prior read level from prior page read.

A lower page read comprising one read level with a single level D read relative to demarcation of $D_D$ may discern the lower bits of the memory cells. In the single D read, those memory cells with programmed threshold voltages less than the demarcation threshold voltage $D_D$ are detected.

A middle page read comprising a three level read with a first level A read relative to demarcation threshold voltage of $D_A$, a second level C read relative to demarcation threshold voltage $D_C$, and a third level F read relative to demarcation threshold $D_F$ may discern the middle bits of the memory cells. In the first level A read, those memory cells with programmed threshold voltages less than the demarcation threshold voltage $D_A$ are detected. In the first level A read, no memory cells are locked out. In the second level C read, those memory cells with programmed threshold voltages less than the demarcation threshold voltage $D_C$ are detected. In the second level C read, Erased state memory cells previously identified under A read in the current middle page may be locked our during C read. In the third level F read, those memory cells with programmed threshold voltages less than the demarcation threshold voltage $D_F$ are detected. In the third level of read F, Erased, A, B, and C state memory cells previously identified under D read from the prior lower page read may be locked out during F read.

An upper page read comprising a three level read with a first level B read relative to demarcation of $D_B$, a second level E read relative to demarcation threshold voltage $D_E$, and a third level G read relative to demarcation of $D_G$ may discern the upper bits. In the first level B read, those memory cells with programmed threshold voltages less than the demarcation threshold voltage $D_B$ are detected. In the first level B read, Erased state memory cells previously identified under A read from the prior middle page read may be locked out during B read. In the second level E read, those memory cells with programmed threshold voltages less than the demarcation threshold voltage $D_E$ are detected. In the second level E read, Erased, A, B, and C state memory cells previously detected under D read from prior lower page read may be locked out. In the third level G read, those memory cells with programmed threshold voltages less than the demarcation threshold voltage $D_G$ are detected. In the third level G read, Erased, A, B, C, D, and E previously detected under F read from prior middle page read may be locked out.

Locking out additional memory cells identified in a prior read level from a prior page read as compared to locking out memory cells identified in a prior level from a current page reduces the number of cells sensed and reduces the Icc or power consumed. Column 960 of table 950 indicates the fraction or percentage of additional memory states locked using prior read level from a prior page read relative the remaining conductive states identified simply by using a prior read level from current page read. The additional memory states locked out are identified from a prior read level which could not have been identified from a prior level in a page read.

For example, in F read in a middle page read, additional C state conductive memory cells may be locked out as well as locking out Erased, A, and B state conducting memory cells. The additional C state memory cells as well as Erased, A, and B state conducting memory cells may be identified from the lower page D read. Erased, A, and B state conducting memory cells could have also been identified in the prior level C read of the current middle page read. In F read, the sense operation is sensing three memory states of the conducting C, D, and E state memory cells if only memory cells identified in the prior C level read of the current page read are locked out. In F read, the sense operation is sensing two conducting memory cell states in a D or E memory state if addition C state memory cells identified in the prior lower page D read are locked out. Therefore, utilizing memory state information in a prior lower page D read in comparison to a prior C read level in a current middle page read results in locking out one additional memory state out of three conducting memory states sensed in the F read.

For example, in B read in an upper page read, additional conductive memory cells in Erased memory states may be locked out. The additional Erased state memory cells are identified from the middle page A read. No additional memory cells could have been identified in the current upper page read without a prior read level or a without a prior dummy read in the current middle page read. In B read, the sense operation is sensing two memory states of conducting Erased and A state memory cells if memory state information is only used from the current upper page read. In B read, the sense operation is sensing one memory state of conducting A state memory cells if Erased state memory cells identified in the prior middle page A read are locked out. Therefore, utilizing memory state information in a prior middle page A read in comparison to a current upper read results in locking out one additional memory state out of two conducting memory states sensed in the B read.

For example, in E read in an upper page read, additional B and C state conductive memory cells may be locked out as well as locking out Erased and A state conducting memory cells. The additional B and C state memory cells as well as Erased and A state conducting memory cells may be identified from the lower page D read. Erased and A state conducting memory cells could have also been identified in the prior level of the current upper page B read. In E read, the sense operation is sensing three memory states of the conducting B, C, and E state memory cells if only memory cells identified in the current upper page B read level are locked out. In E read, the sense operation is sensing one memory state of conducting D state memory cells if additional B and C state memory cells identified in the prior lower page D read are additionally locked out. Therefore, utilizing information in a prior lower page D read in comparison to a prior B read level in a current upper page read results in locking out two additional memory states out of three conductive memory states sensed in the E read.

For example, in G read in a upper page read, additional E state conductive memory cells may be locked out as well as locking out Erased, A, B, C, and D state conducting memory cells. The additional E state memory cells as well as Erased, A, B, C, and D state conducting memory cells are identified from the middle page F read. Erased, A, B, C, and D state conducting memory cells could have also been identified in the prior level of the current upper page E read. In G read, the sense operation is sensing two memory states of the conducting E and F state memory cells if only memory cells identified in the current upper page E read level are locked out. In G read, the sense operation is sensing one conducting memory cell state in an F memory state if additional E state memory cells identified in the prior middle page F read are additionally locked out. Therefore, utilizing information in a prior middle page F read in comparison to a prior E read level in a current upper page read results in locking out one additional memory states out of two conductive memory states sensed in the G read.

FIGS. 10(A)-10(I) are timing diagrams of the operation of the sense module 130, 480 shown in FIG. 1 and FIG. 5 during the 3-pass read as applied to a NAND memory cell that is part of a memory page in parallel, but other timing and sense modules are possible. The timing diagram will be described in reference to middle page read of the 2-3-2 read scheme of FIGS. 7A-7B. This example shows a 3-level read of B read, D read, and F read relative to demarcation threshold voltage of $D_B$, demarcation threshold voltage $D_D$, and demarcation threshold $D_F$ respectively. At the beginning of each read level, the memory cells which are not locked out will have their bit lines selected for precharged. The locked out memory cells will be discharged to ground. Selected word lines signal are supplied a voltage to the control gate of the selected cell in the NAND string to set a demarcation threshold voltage, such as a demarcation threshold voltage $D_B$ in anticipation of the B read suboperation. A strobe signal STB enables a latching of the results of the read suboperation.

Figure 10:
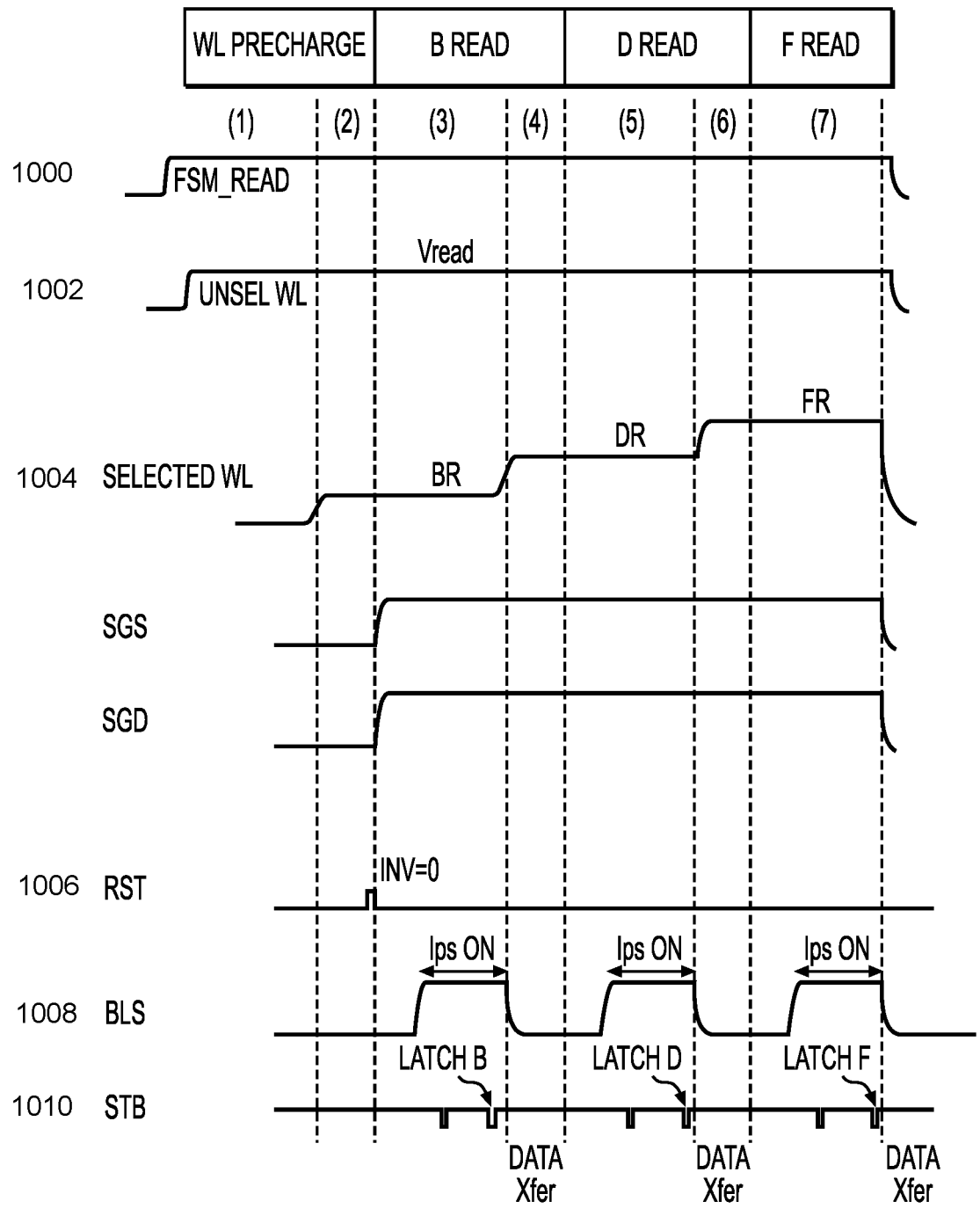
FIG. 10 is a timing diagram that illustrates the operation of the sense module shown in FIG. 5 during the 3-pass read as applied to a NAND memory cell that is part of a memory page in parallel according to aspects of the disclosure.

FIG. 10 shows the read operation to be divided into seven phases, with phases (1) and (2) grouped under a world line precharge suboperation, followed by phases (3) and (4) under B read, phases (5) and (6) under D read and phase (7) under F read suboperations respectively. Reference numeral 1000 shows that the read operation is timed at the start and end by the FSM_READ signal rising and falling respectively.

The world line precharge suboperation begins at phase (1) with the unselected word lines of the NAND chain precharging with the rise of the Unsel WL signal as shown with reference numeral 1002. This supplies a voltage of Vread (e.g. 5.5V) to the control gates of the unselected cells in the NAND chain in order to turn them fully on. At phase (2), the selected word line of the NAND chain begins precharging with the rise of the Selected WL signal as shown with reference numeral 1004. This supplies a voltage BR to the control gate of the selected cell in the NAND chain and effectively sets the demarcation threshold voltage $D_B$ in anticipation of the B read suboperation to follow.

The B read suboperation begins at phase (3) with the signal RST resetting the sense amplifier's output signal INV to zero (reference numeral 1006). At the same time, the NAND chain is enabled for connection to the bit line by the signals SGS and SGD turning on a pair of select transistors of the NAND chain. The bit line is then coupled to the sense module by an enabling signal BLS (reference numeral 1008). At that moment, the precharge/clamp circuit 640 in the sense module charges up the bit line to a predetermined voltage (e.g. 0.5V) against a draining conduction current, IDs, of the memory cell (shown as "IDs ON" in FIG. 10(H). As soon as the bit line voltage is stable, a strobe signal STB enables a latching of the result of the cell current discriminator 650 into the latch 660 (shown as "Latch B" or "Latch D" or "Latch F" in FIG. 10(I)). If the programmed threshold voltage of the memory cell is less than that of the demarcation threshold $D_B$, (or equivalently, the cell's conduction current is higher than a demarcation current) the node SEN or SEN2 will be drained down to LOW by the conduction current. This will result in a latch result with an INV signal at HIGH. Conversely, if the programmed threshold voltage of the memory cell is higher than $D_B$, SEN2 will be detected to be HIGH and INV will be latched LOW. As soon as the data from the sense amplifier is latched, the signal BLS goes LOW, thereby disconnecting the memory cell from the sense module.

For those higher current memory cells where the sensing results in the signal INV being latched at HIGH, a pull-down circuit 486 pulls down their bit lines to ground. This effectively turns off the conduction currents and the power drain of those memory cells. In a preferred implementation, an additional earlier reading (see first strobe STB in phase (3) of reference numeral 1010) is made by the sense amplifier with a limited bit line pull-up. This will identify those memory cells with even higher conduction current states and have their bit lines latched to ground as soon as possible in order to turn off their conduction currents.

In phase (4), the data in the SEN2 is transferred out via the readout bus 499 when the transfer gate 488 is enabled by the signal NCO. This is denoted by "Data Xfer" in FIG. 10.

The suboperations D read and F read are each similar to that of B read, with corresponding shifting of the selected WL voltage to DR and FR respectively.

According to an aspect, it nay be preferable to sense progressively from the lower threshold voltage (such as from state "B"). This means the higher current cells are identified first for early disposal. If the cell has a programmed threshold voltage less than $D_B$, it is regarded as a conducting cell. The conducting cell will be discharged to ground after sensing at "B". This effectively turns off the conduction current in the cell. If the cell has a programmed threshold voltage higher than $D_B$, then it is regarded as non-conducting at "B" and the bit line will be kept at a constant value and not discharged. For the second suboperation of sensing at "D" level, only the bit lines of the non-conducting cells at "B" need be selectively charged up. This means that the sense module latches for the page are not reset to force INV back to zero (i.e., not reset to clear the bit line pulldown with INV=1). In this way, the cells which have a programmed threshold voltage less than $D_B$ will not be charged up, thereby saving power. It will be seen that with each successive sensing, more and more of the memory cell in the page are turned off as they are irrelevant to subsequent sensing. In this way, the power drained by the memory cells in the page is minimized.

While the example described refers to a read operation involving three demarcation threshold voltages, the methods and principle described are generally applicable to read operations with more than one pass where subsequent passes can take advantage of information obtained in an earlier pass to selectively turn off the cells irrelevant to the current pass. It should also be noted that in conventional implementations, the sensing relative to each memory state is independent of each other. That is, each sensing will go through exactly same number of steps, i.e., from phase (1) to phase (4) for each of B read, D read and F read. In the present sensing, only the first read pass, B read will reset all the sense amplifier's latches of the page to INV=0 in order to precharge all the bit lines in the page. Subsequent sensing will only charge up those bit lines with INV=0 while not charging those bit lines that have their INV's flipped during previous sensing.

In certain embodiments, the term identifying memory cells in a read level may include those memory cells that are locked out since those memory cells should have been identified in the read level. In certain embodiments, it is understood that locking out memory cells in a read level may utilize information or latches from one or more prior read levels from a prior page read alone or in combination with a current page read.

As discussed, memory cells may have threshold voltage windows partitioned into several regions representing several memory states. The regions are demarcated by the set of demarcation threshold voltages. Comparing the programmed threshold voltage with a plurality of demarcation threshold voltages when sensing a memory cell determines in which region the programmed threshold voltage lies. At a subsequent page read, the memory cells with programmed threshold voltages lower than the current demarcation threshold voltage can be identified from a prior page read and can be locked out. Thus, turning-off or inhibiting the conduction current of the previously identified memory cells from prior page reads (alone or in combination with previously identified memory cells form a prior read level from a current page read) reduces the current and power consumed.

Figure 11:
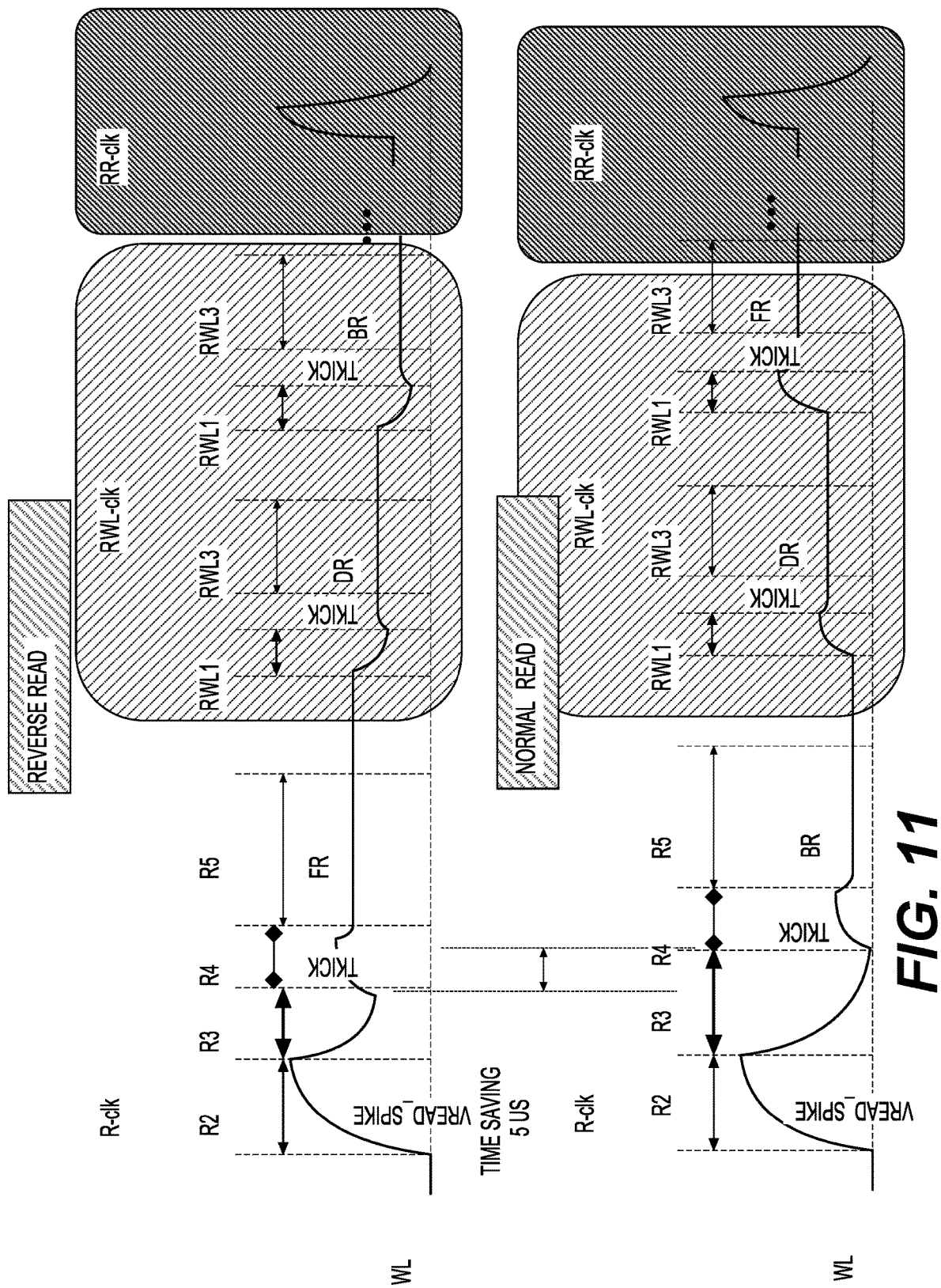
FIG. 11 shows an example series of read voltages applied to a selected word line for both a normal read and a reverse read when reading a middle page according to aspects of the disclosure.

FIG. 11 shows an example series of read voltages applied to a selected word line for both a normal read and a reverse read when reading a middle page. Various time periods or portions of the period of time in which the read operation occurs are shown. These time periods include a first verify stage R-clk, a second program-verify stage RWL-clk, and a discharge stage RR-clk. The first verify stage R-clk is further divided into periods including a second portion R2, third portion R3, fourth portion R4, and settling period R5 of the first verify stage R-clk. Similarly, the second program-verify stage RWL-clk can include periods RWL1 and RWL3. In addition, a "kicking voltage" (i.e., an overshoot or undershoot of the voltage) may be applied to the selected word line in the time period labeled Tkick (e.g., during R4 and between RWL1 and RWL3) to help the voltage on the selected word line reach the target or reference voltage more quickly. As shown, for the normal read (upper portion of FIG. 11), the series of read voltages become increasing higher in magnitude with each successive data state that is being sensed. In contrast, for the reverse order read or reverse read (lower portion of FIG. 11), the read voltages of the series become increasing lower in magnitude with each successive data state that is being sensed. FIG. 12 is a table illustrating the sequences of the data states being sensed for each of a lower page, middle page, and upper page for both the normal read and the reverse read. As previously discussed, the reverse read can improve the speed of the read operation by reducing the transition from the initial voltage spike (VREAD_SPIKE) to the first one of the series of read voltages. For example, with the middle page read, the word line voltage ramps from VREAD_SPIKE(~10V) to the F state (~5V), in contrast with normal read sequence the word line voltage ramps down from VREAD_SPIKE(~10V) to B state (~1V). FIG. 13 is a table illustrating example timing of the first verify stage R-clk and the second program-verify stage RWL-clk. As shown, the voltage transition is reduced and the speed of the read operation is improved (e.g., 5 us).

Figure 14:
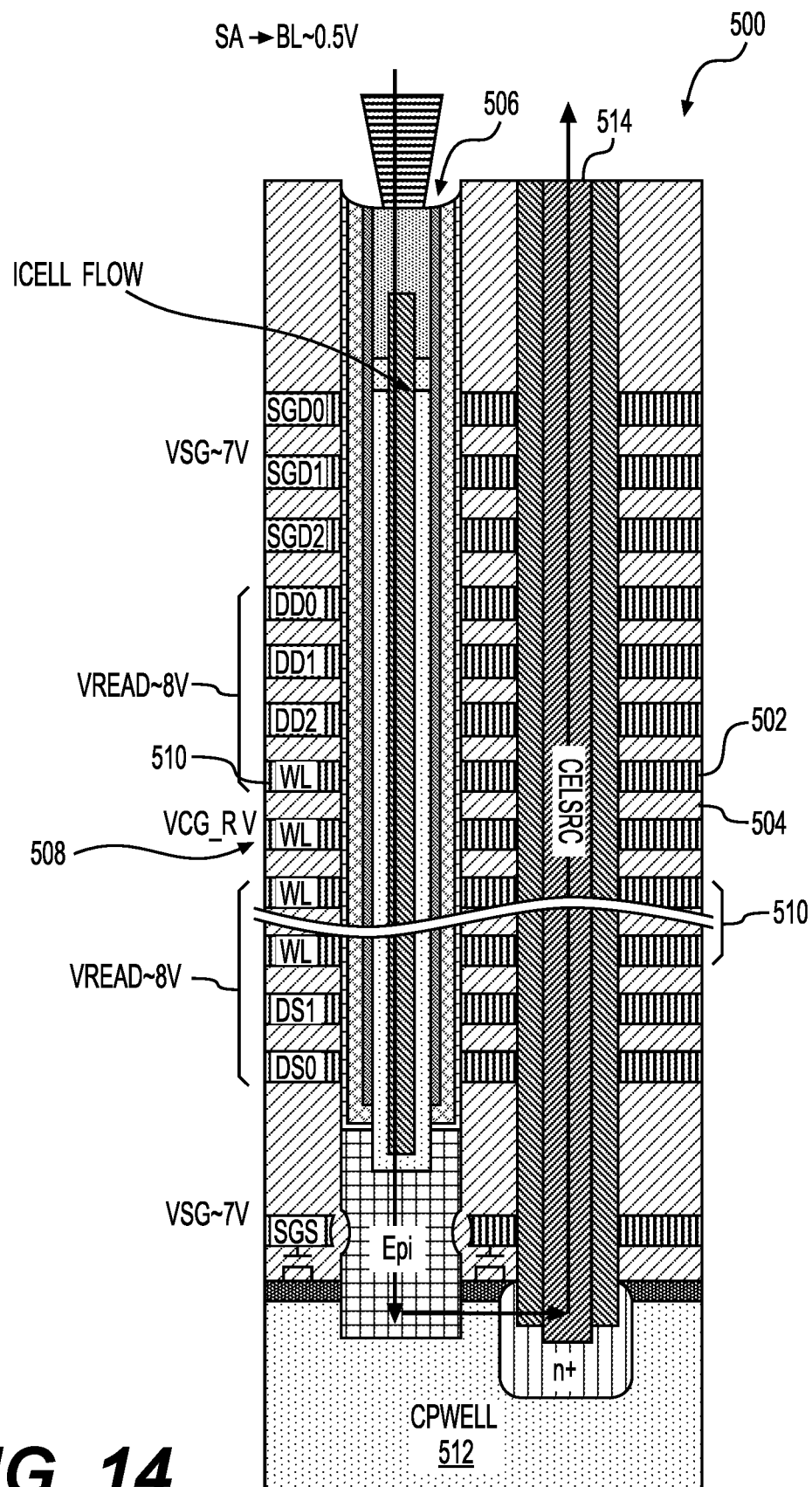
FIG. 14 shows an example memory structure including a plurality of conductive layers or word lines alternating with a plurality of dielectric layers and a memory hole extending vertically through the layers to form the memory cells according to aspects of the disclosure.

FIG. 14 shows an example memory structure 500 including a plurality of conductive layers or word lines 502 alternating with a plurality of dielectric layers 504 and a memory hole 506 extending vertically through the layers 502, 504 to form the memory cells. Specifically, the plurality of word lines 502 includes a selected word line 508, shown with the read voltage VCG_RV applied and a plurality of unselected word lines 510 with the read pass voltage VREAD applied. When the memory cell associated with the selected word line 508 is conducting, the string of memory cells conducts current (ICELL flow) from the bit line (BL) down through the memory hole 506 to a P-well 512 (CP-WELL) and through a source line 514 (CELSRC) that is also coupled to the P-well 512.

Figure 15:
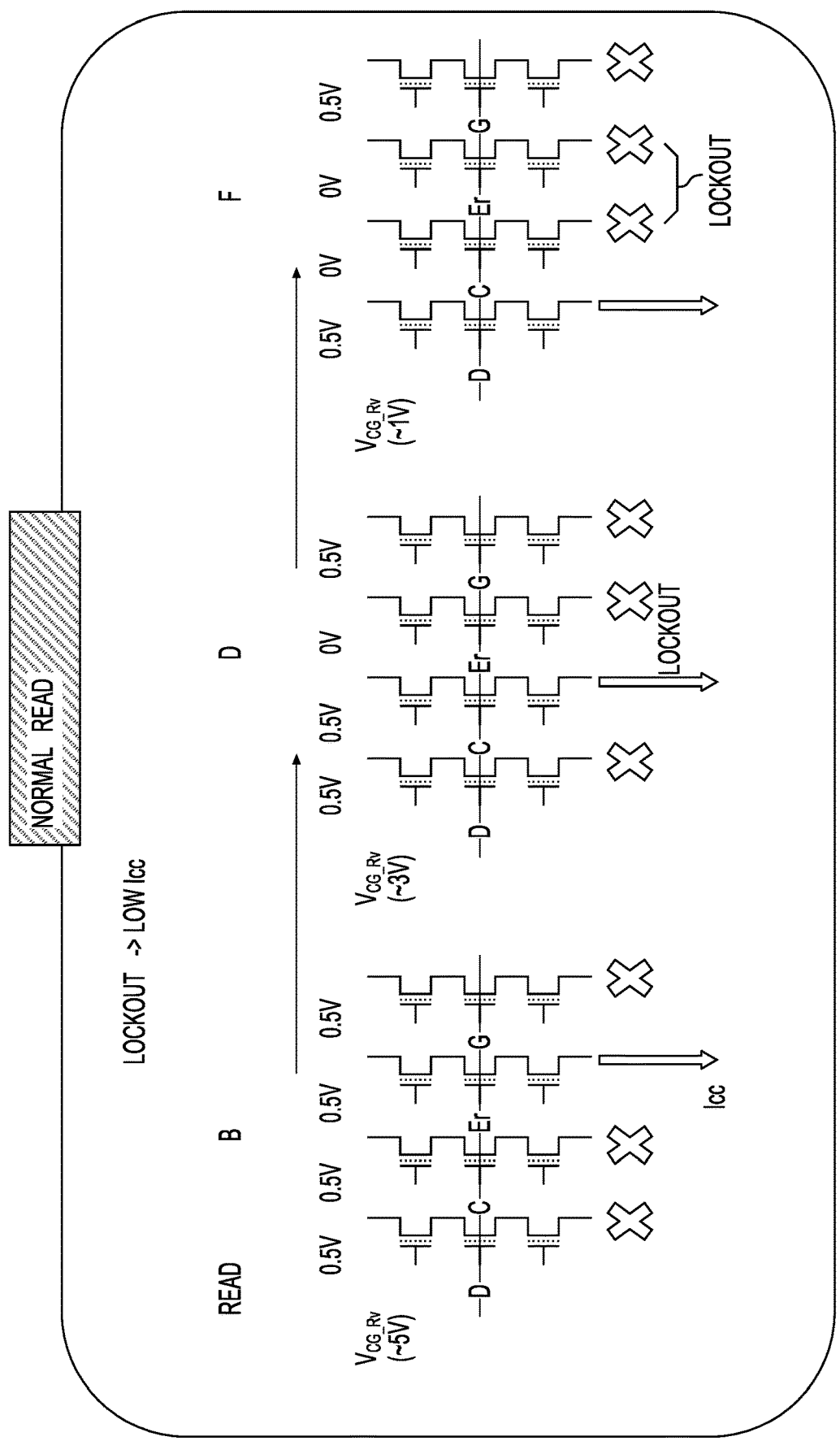
FIG. 15 shows a group of strings of memory cells with read voltages of the series of read voltages applied to the selected word line during the normal read of the middle page according to aspects of the disclosure.

FIG. 15 shows a group of strings of memory cells with read voltages of the series of read voltages applied to the selected word line (e.g., word line 508 of FIG. 15) during the normal read of the middle page. The normal read achieves comparatively low Icc, since most of the NAND channels strings are OFF due to the "Lockout" mode. In the lockout mode the bitlines (BL) of memory cells sensed as conducting are set to VCELSRC (0V) to cut off the channel and save Icc. For example, as shown, after sensing the B state, the third channel or string with the memory cell in the Er state is set to be locked out with VBL=0, to save Icc. However, the lockout (conducting cell) mode only applies to the normal read sequence where the next read level is higher than the current read level.

Figure 16:
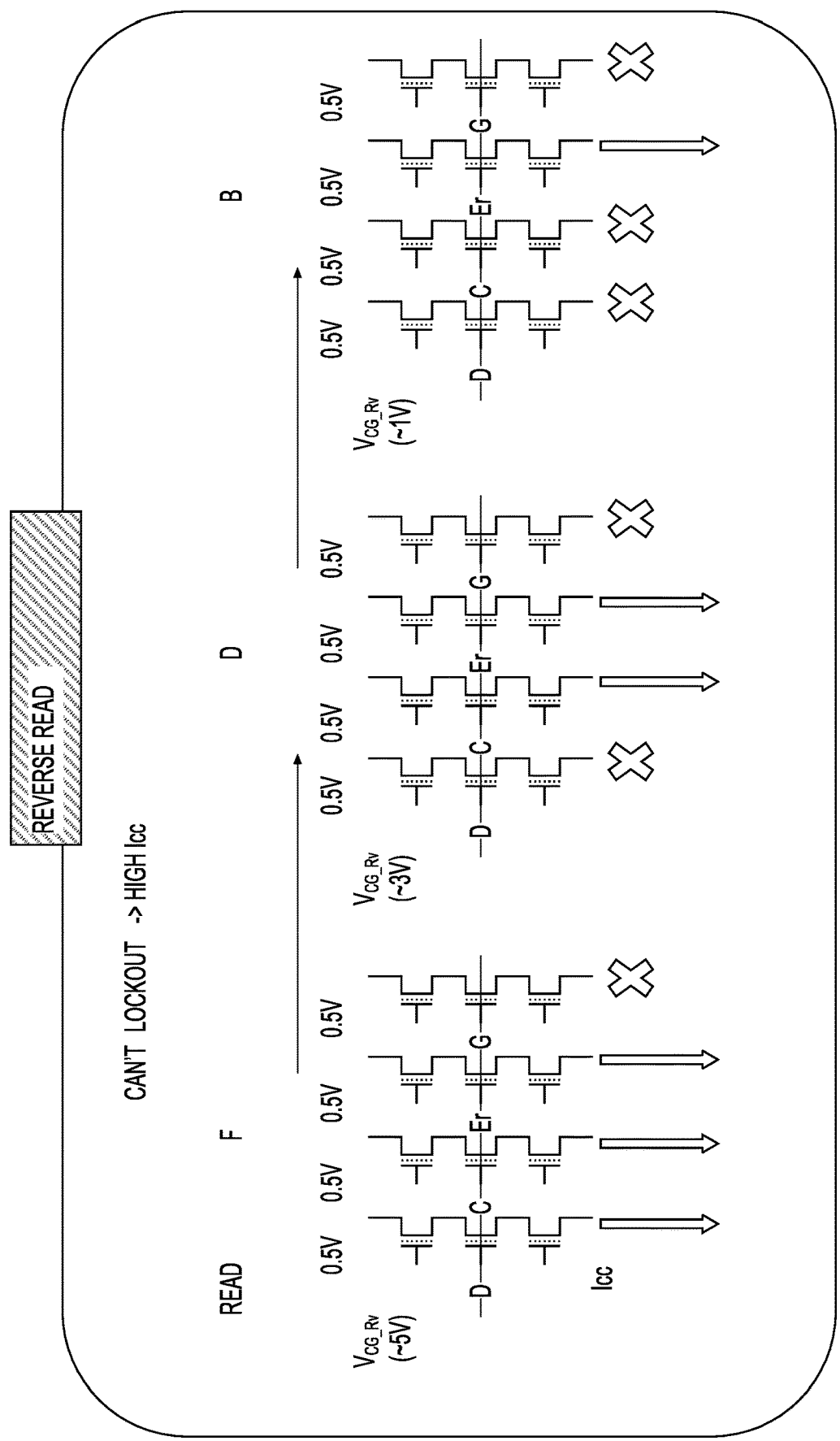
FIG. 16 shows a group of strings of memory cells with read voltages of the series of read voltages applied to the selected word line during the reverse read of the middle page according to aspects of the disclosure.

FIG. 16 shows a group of strings of memory cells with read voltages of the series of read voltages applied to the selected word line during the reverse read of the middle page. As shown, the lockout mode will not work for the reverse read sequence. Specifically, when the higher state has been read, the conducting channel cannot be locked out yet, since the next read state (being lower) might be in one of the conducting channels. So, during the reverse read operation, most of the channels are conducting, leading to a significant Icc.

Consequently, described herein is a memory apparatus (e.g., memory device 100 in FIG. 1) including a page (e.g., a predetermined quantity or grouping of memory cells 10) of memory cells (e.g., memory cell 10 in FIG. 2) with each of the memory cells connected to one of a plurality of word lines (e.g., $WL_0$-$WL_{31}$ in FIG. 5). The memory cells are arranged in one or more strings (e.g., string 50 in FIG. 5) and each is configured to retain a threshold voltage Vt or Vth corresponding to one of a plurality of memory states (e.g., "Er", "A", "B", "C", "D", "E", "F" and "G" in FIG. 4). The apparatus also includes a control circuit (e.g., control circuitry 110, controller 122, row decoder 124, source control circuits 127, read write circuits 128, sense modules 130, and column decoder 132 in FIG. 1) coupled to the plurality of word lines and the one or more strings. The control circuit is configured to identify the memory cells having the threshold voltage less than a primary demarcation threshold voltage of a series of a plurality of demarcation threshold voltages for demarcating between the plurality of memory states in a page read discerning a page bits of the page of the memory cells. The control circuit is also configured to identify the memory cells having the threshold voltage less than a secondary demarcation threshold voltage of the series. The control circuit supplies an extremely low or near zero voltage (i.e., bit line voltage of approximately zero) to the one or more strings of the memory cells identified as having the threshold voltage less than at least one of the primary and secondary demarcation threshold voltages in the page read to inhibit conduction currents while identifying the memory cells having the threshold voltage less than a tertiary demarcation threshold voltage of the series.

As discussed, each of the one or more strings is connected to one of a plurality of bit lines (e.g., bit line 36 of FIG. 5) coupled to the control circuit. So, according to an aspect, to implement the lockout mode, the control circuit is further configured to ground the one of the plurality of bit lines to inhibit the conduction currents of the one or more strings of the memory cells identified as having the threshold voltage less than the secondary demarcation threshold voltage in the page read. Thus, an electrical current and power consumed by the apparatus during operation are reduced.

According to an aspect, the secondary demarcation threshold voltage of the series is lower than the primary demarcation threshold voltage and the tertiary demarcation threshold voltage of the series is higher than the secondary demarcation threshold voltage and the primary demarcation threshold voltage is selected to minimize an amount of time for the one of the plurality of word lines to ramp down to the primary demarcation threshold voltage from an initial word line voltage (VREAD_SPIKE) that is higher than the primary demarcation threshold voltage. Thus, such a read sequence advantageously provides benefits of both the normal and reverse read, namely (1) fast ramp down during R-clk (reverse read benefit); (2) read lockout for Icc saving (normal read benefit), simultaneously.

So, with reference back to FIG. 14, the control circuit is further configured to apply a primary read voltage corresponding to the primary demarcation threshold voltage (e.g., VCG_RV corresponding to one of $D_A$, $D_B$, $D_C$, $D_E$, $D_F$, or $D_G$) to a selected one of the plurality of word lines (e.g., word line 508 of FIG. 14) while applying a read pass voltage VREAD to unselected ones of the plurality of word lines (e.g., word lines 510 of FIG. 14). The control circuit simultaneously senses the conduction currents of the memory cells of one or more strings to identify the memory cells of the one or more strings having the threshold voltage less than the primary demarcation threshold voltage. Similarly, the control circuit applies a secondary read voltage corresponding to the secondary demarcation threshold voltage to the selected one of the plurality of word lines while applying the read pass voltage VREAD to the unselected ones of the plurality of word lines and sensing the conduction currents of the memory cells of the one or more strings to identify the memory cells of the one or more strings having the threshold voltage less than the secondary demarcation threshold voltage. In addition, the control circuit applies a tertiary read voltage corresponding to the tertiary demarcation threshold voltage to the selected one of the plurality of word lines while applying the read pass voltage VREAD to the unselected ones of the plurality of word lines and sensing the conduction currents of the memory cells of the one or more strings to identify the memory cells of the one or more strings having the threshold voltage less than the tertiary demarcation threshold voltage.

According to an aspect, the page read is selected from a group consisting of a lower page read and a middle page read and an upper page read (for memory cells configured to each store three bits). Referring back to FIGS. 4 and 8, the lower, middle, and upper bits for each of plurality of memory states may be encoded differently. Thus, the series of the plurality of demarcation threshold voltages are based on an encoding scheme of the plurality of memory states.

As discussed above, and still referring back to FIGS. 4 and 8, the threshold voltage of each of the memory cells are within a common range of the threshold voltage defining a threshold window and the plurality of memory states can include eight memory states. As shown, for eight memory states, the plurality of demarcation threshold voltages include, in respective order of increasing magnitude of the threshold voltage, a first demarcation threshold voltage $D_A$, a second demarcation threshold voltage $D_B$, a third demarcation threshold voltage $D_C$, a fourth demarcation threshold voltage $D_D$, a fifth demarcation threshold voltage $D_E$, a sixth demarcation threshold voltage $D_F$, and a seventh demarcation threshold voltage $D_G$. The plurality of memory states includes an eighth memory state "G" in which the threshold voltage of the memory cells is greater than the seventh demarcation threshold voltage $D_G$ and a seventh memory state "F" in which the threshold voltage of the memory cells is greater than the sixth demarcation threshold voltage $D_F$. The plurality of memory states includes a sixth memory state "E" in which the threshold voltage of the memory cells is greater than the fifth demarcation threshold voltage $D_E$ and a fifth memory state "D" in which the threshold voltage of the memory cells is greater than the fourth demarcation threshold voltage $D_D$. In addition, the plurality of memory states includes a fourth memory state "C" in which the threshold voltage of the memory cells is greater than the fifth demarcation threshold voltage $D_C$ and a third memory state B in which the threshold voltage of the memory cells is greater than the second demarcation threshold voltage $D_B$. Additionally, the plurality of memory states includes a second memory state "A" in which the threshold voltage of the memory cells is greater than the fifth demarcation threshold voltage $D_A$ and a first memory state Er in which the threshold voltage of the memory cells is less than the first demarcation threshold voltage $D_A$.

Figure 17:
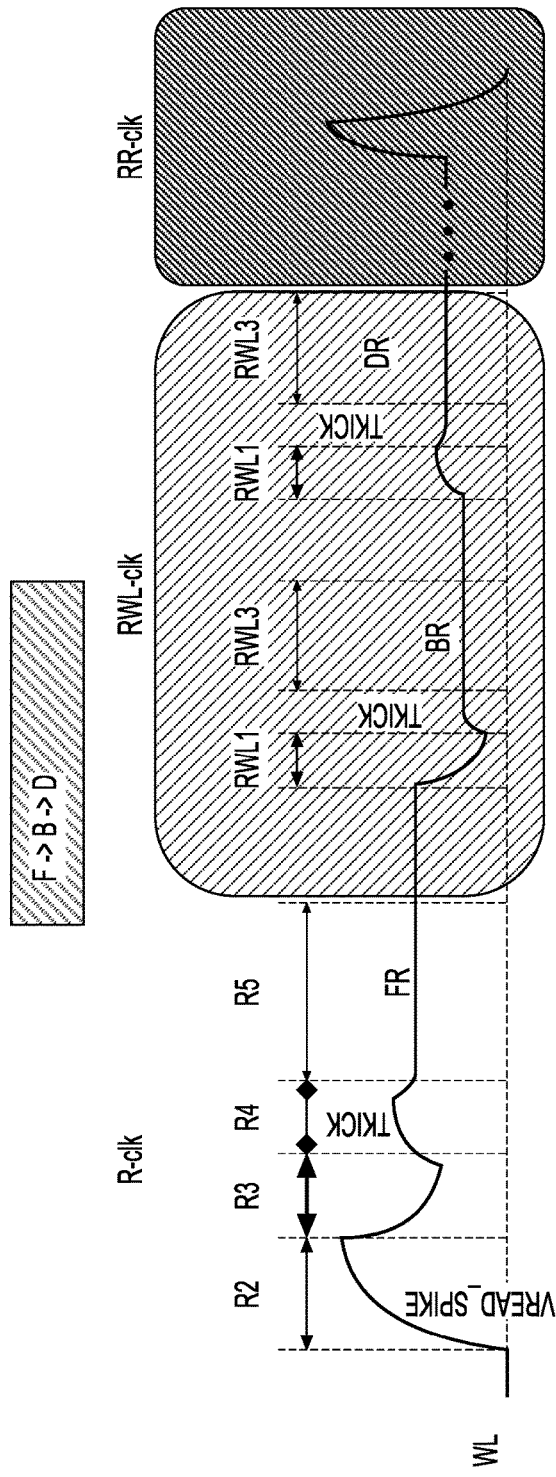
FIG. 17 shows one example series of read voltages for the middle page read according to aspects of the disclosure.

FIG. 17 shows one example series of read voltages for the middle page read. So, as in the reverse read discussed above, the first read level is associated with the F state. In other words, the primary demarcation threshold voltage is the sixth demarcation threshold voltage $D_F$. Therefore, the benefit of "fast" ramping down is realized, since the difference in the magnitude between the initial word line voltage (VREAD_SPIKE) and the primary read voltage (e.g., FR) is less than a difference between the initial word line voltage and the read voltages for other memory states that are sensed during the middle page read. The control circuit then moves on to the next read states, here the third memory state "B" and then onto the fifth memory state "D". So, according to an aspect, the secondary demarcation threshold voltage is the second demarcation threshold voltage $D_B$ and the tertiary demarcation threshold voltage is the fourth demarcation threshold voltage $D_D$. Because the third read voltage (associated with the fourth demarcation threshold voltage $D_D$) is greater than the secondary read voltage (associated with the second demarcation threshold voltage $D_B$), the read lockout mode can still be utilized to save Icc.

Figure 18:
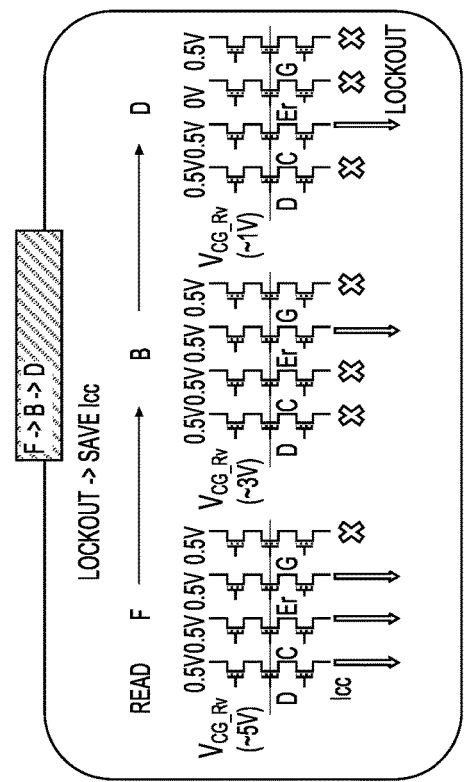
FIG. 18 shows a group of strings of memory cells with read voltages of the series of read voltages of FIG. 17 applied to a selected word line during the middle page read according to aspects of the disclosure.

FIG. 18 shows a group of strings of memory cells with read voltages of the series of read voltages of FIG. 17 (e.g., the primary demarcation threshold voltage being the sixth demarcation threshold voltage $D_F$, the secondary demarcation threshold voltage being the second demarcation threshold voltage $D_B$, and the tertiary demarcation threshold voltage being the fourth demarcation threshold voltage $D_D$) applied to the selected word line during the middle page read. Thus, the control circuit is configured to record the memory cells of the one or more strings identified as having the threshold voltage less than the secondary demarcation threshold voltage. The control circuit then inhibits the conduction currents of the one or more strings (e.g., by supplying an extremely low or near zero bit line voltage) of the memory cells identified as having the threshold voltage less than the secondary demarcation threshold voltage (e.g., the second demarcation threshold voltage $D_B$) while identifying the memory cells having the threshold voltage less than the tertiary demarcation threshold voltage of the series (e.g., the fourth demarcation threshold voltage $D_D$). So, after finishing reading the third memory state "B", the lockout mode is enabled cutting off all conducting channels with cells Vt<BR. During the read or sensing of the fifth memory state "D", bit lines conducting channels with cells Vt<BR are set to 0V for the previous lockout channels (e.g., the conducting channels with cells Vt<BR such as the third string in FIG. 18) to save Icc.

Figure 19:
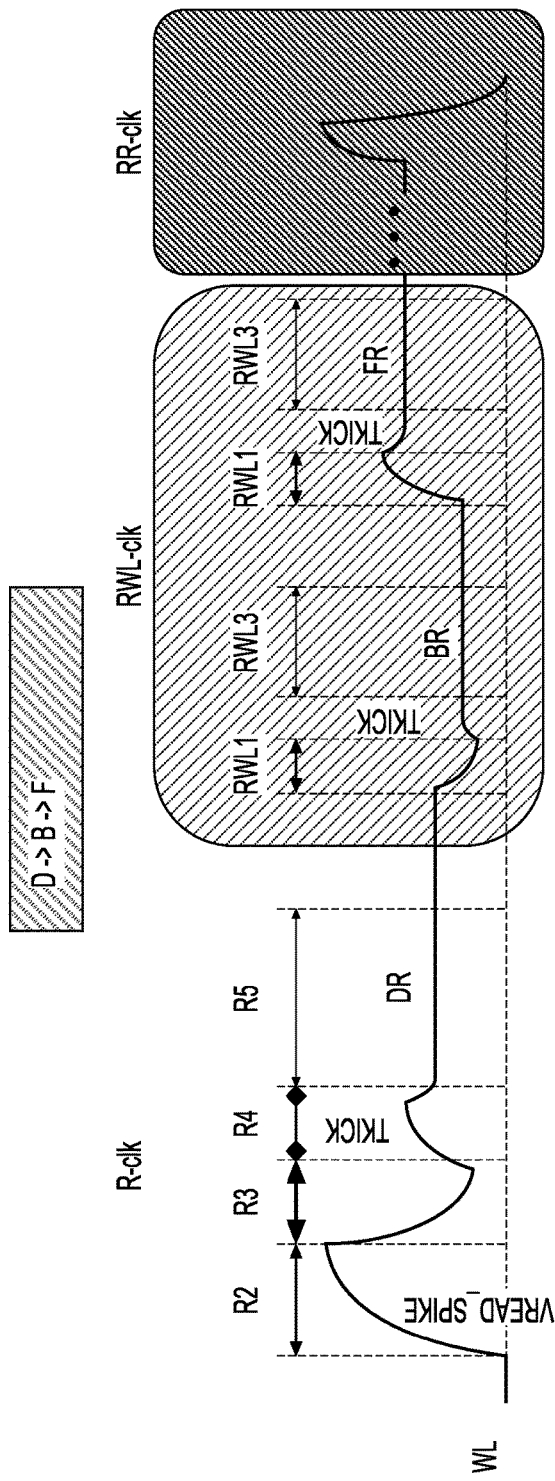
FIG. 19 shows another example series of read voltages for the middle page read according to aspects of the disclosure.

FIG. 19 shows another example series of read voltages for the middle page read. Here, the first read state is the fifth memory state "D" and the primary demarcation threshold voltage is the fourth demarcation threshold voltage $D_D$. Again, the benefit of "fast" ramping down is realized, due to the small difference in the magnitude between the initial word line voltage (VREAD_SPIKE) and the primary read voltage (e.g., DR). The control circuit then moves on to the next read states, here the third memory state "B" and then onto the seventh memory state "F". So, according to an aspect, the secondary demarcation threshold voltage is the second demarcation threshold voltage $D_B$ and the tertiary demarcation threshold voltage is the sixth demarcation threshold voltage $D_F$. Because the third read voltage (associated with the sixth demarcation threshold voltage $D_F$) is greater than the secondary read voltage (associated with the second demarcation threshold voltage $D_B$), the read lockout mode can still be utilized to save Icc.

Figure 20:
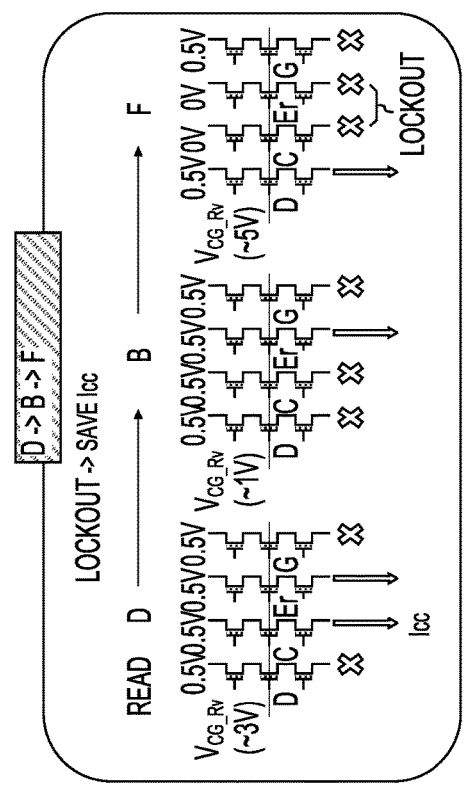
FIG. 20 shows another group of strings of memory cells with read voltages of the series of read voltages of FIG. 19 applied to the selected word line during the middle page read according to aspects of the disclosure.

FIG. 20 shows another group of strings of memory cells with read voltages of the series of read voltages of FIG. 19 (e.g., the primary demarcation threshold voltage being the fourth demarcation threshold voltage $D_D$, the secondary demarcation threshold voltage being the second demarcation threshold voltage $D_B$, and the tertiary demarcation threshold voltage being the sixth demarcation threshold voltage $D_F$) applied to the selected word line during the middle page read. Thus, the control circuit is configured to record the memory cells of the one or more strings identified as having the threshold voltage less than the primary demarcation threshold voltage (e.g., the fourth demarcation threshold voltage $D_D$) as a first group. The control circuit is also configured to record the memory cells of the one or more strings identified as having the threshold voltage less than the secondary demarcation threshold voltage (e.g., the second demarcation threshold voltage $D_B$) as a second group. The control circuit then inhibits the conduction currents of the one or more strings of the memory cells (e.g., by supplying an extremely low or near zero bit line voltage) in both the first group and the second group (e.g., having the threshold voltage less than the fourth demarcation threshold voltage $D_D$ and the second demarcation threshold voltage $D_B$) while identifying the memory cells having the threshold voltage less than the tertiary demarcation threshold voltage of the series (e.g., sixth demarcation threshold voltage $D_F$). In other words, after finishing reading the fifth memory state "D" as the first read state, the control circuit stores the all the conducting channels as the first group (CHL1) for cells with Vt<DR, then move on to the third memory state "B". After sensing the third memory state "B", the control circuit locks out all the conducting channels in the second group (CHL2) with cells Vt<BR. So during the read or sensing of the seventh memory state "F", bit lines are set to 0V for the previous lockout channels (e.g., the conducting channels of the first group (CHL1) and the second group (CHL2), CHL1+CHL2) such as the second and third strings in FIG. 20) to save Icc.

The read sequences described in FIGS. 17-20 advantageously provide several benefits. Specifically, the word line voltage ramping down during the R-clk happens more quickly, thus the read performance is improved over the normal read sequence shown in FIGS. 11 and 16 that does not allow for the word line voltage to ramp down as quickly. In addition, the read lockout mode can still be utilized to save Icc (thus power consumption) as compared to the reverse read shown FIGS. 11 and 16. No modification of a layout or process of the memory apparatus is required, so it can be implemented with no or minimal added cost.

Figure 21:
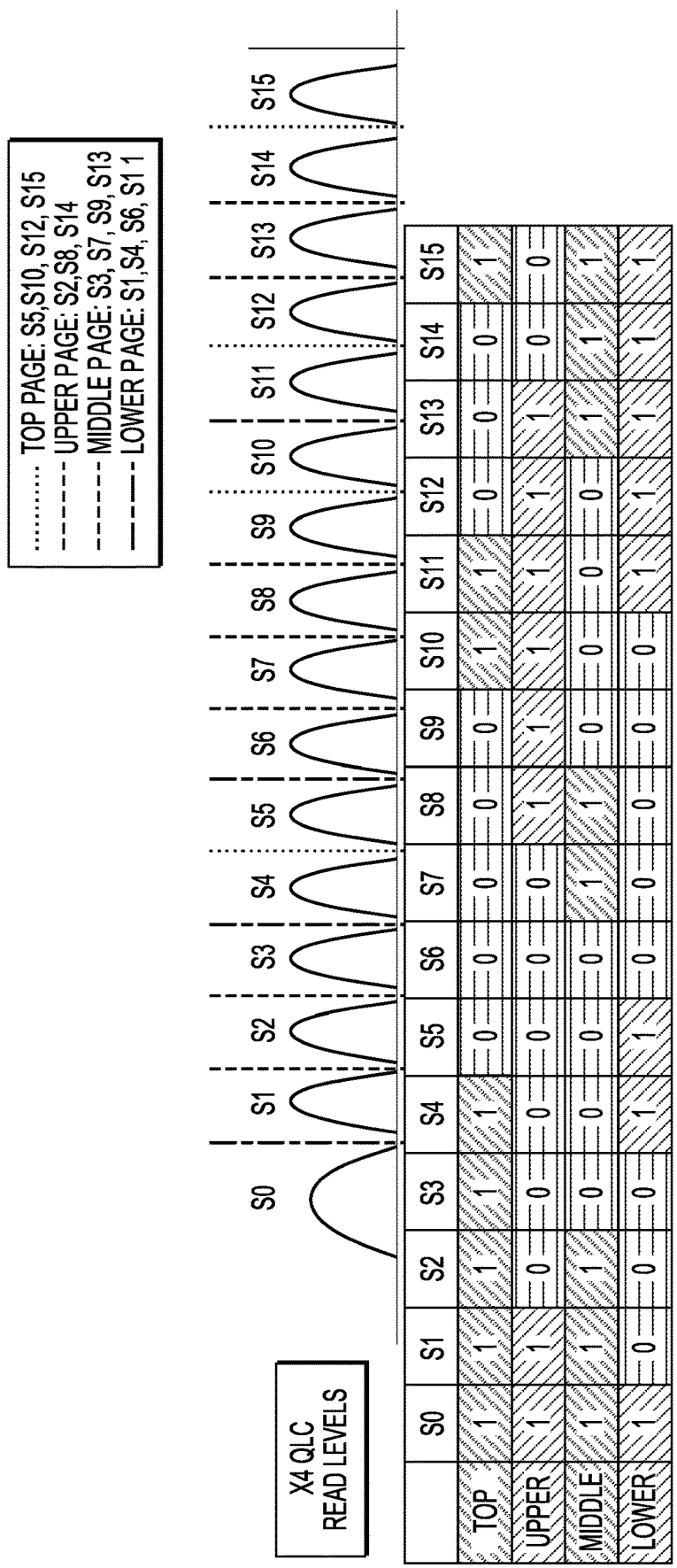
FIG. 21 shows read levels and memory states associated with quadruple-level memory cells according to aspects of the disclosure.

Embodiments of memory devices and sensing methods have been described in reference to memory cells having eight memory states and operating as a triple-level cell (TLC) or X3 cell storing 3 bits/cell. Embodiments of memory devices and sensing methods disclosed herein are also applicable to memory cells may have more than eight memory states, such as sixteen memory states operating as a quadruple-level memory cell (QLC) or X4 cell storing 4 bits/cell. For example, FIG. 21 shows read levels and memory states associated with quadruple-level memory cells (QLC). Specifically, a top page read involves bits of a fifth memory state, a tenth memory state, a twelfth memory state, and a fifteenth memory state. An upper page read involves bits of a second memory state, an eighth memory state, and a fourteenth memory state. A middle page read involves bits of a third memory state, a seventh memory state, a ninth memory state, and a thirteenth memory state. A lower page read involves bits of a first memory state, a fourth memory state, a sixth memory state, and an eleventh memory state. So, the series of the plurality of demarcation threshold voltages could include not only the primary, secondary, and the tertiary demarcation threshold voltages, but could also include a quaternary demarcation threshold voltage, since the top, middle, and lower pages for the QLC memory cell example all involve four memory states. Just as in the examples of the middle page read for the TLC cell shown in FIGS. 17-20, the primary demarcation threshold voltage for the QLC cell could be selected to minimize an amount of time for the one of the plurality of word lines to ramp down to the primary demarcation threshold voltage from an initial word line voltage (VREAD_SPIKE) to improve the read speed. In addition, the secondary demarcation threshold voltage of the series for the QLC could be lower than the primary demarcation threshold voltage. One or more of the secondary, tertiary, and quaternary demarcation threshold voltages of the series could become progressively higher (e.g., the secondary demarcation threshold voltage<the tertiary demarcation threshold voltage<the quaternary demarcation threshold voltage) enabling the lockout mode and saving Icc.

Figure 22:
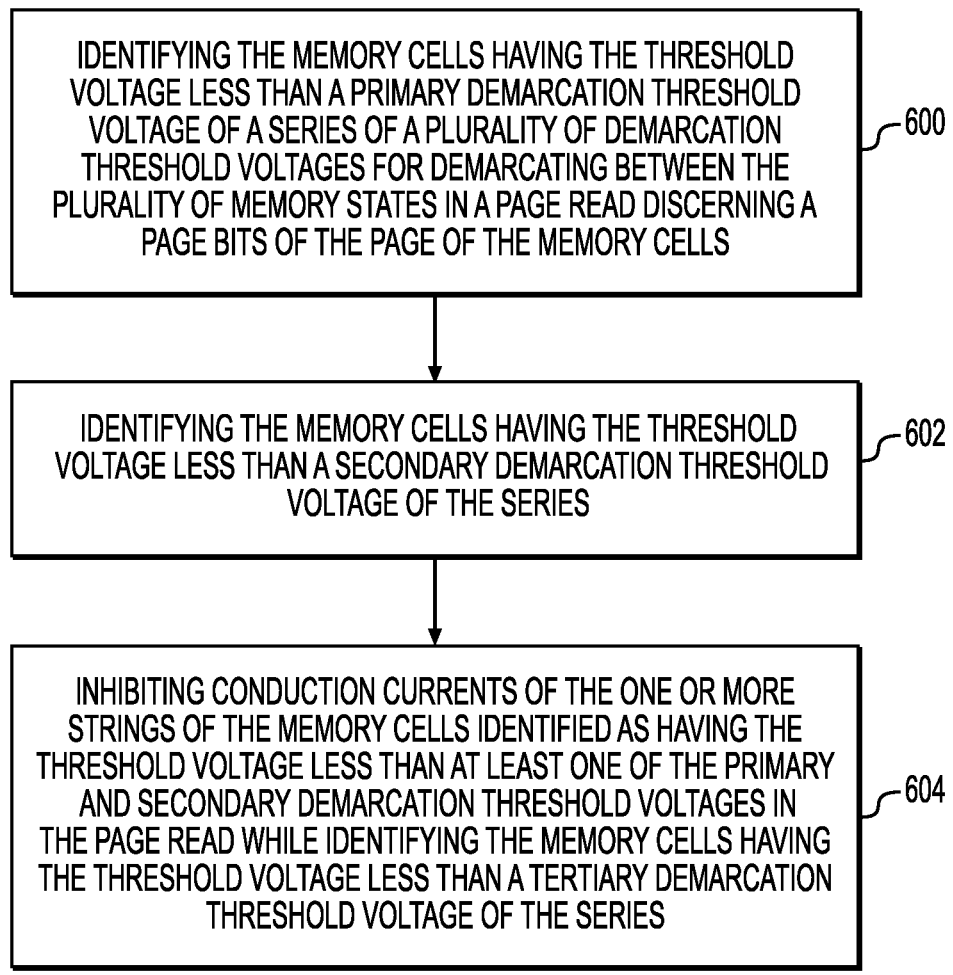
FIG. 22 illustrates steps of a method of operating a memory apparatus according to aspects of the disclosure.

Now referring to FIG. 22, a method of operating a memory apparatus is also provided. As discussed above, the memory apparatus includes a page of memory cells. Each of the memory cells is connected to one of a plurality of word lines and the memory cells are arranged in one or more strings. Each of the memory cells is configured to retain a threshold voltage corresponding to one of a plurality of memory states. Thus, the method includes the step of 600 identifying the memory cells having the threshold voltage less than a primary demarcation threshold voltage of a series of a plurality of demarcation threshold voltages for demarcating between the plurality of memory states in a page read discerning a page bits of the page of the memory cells. The method proceeds with the step of 602 identifying the memory cells having the threshold voltage less than a secondary demarcation threshold voltage of the series. The method also includes the step of 604 supplying a near zero voltage to the one or more strings of the memory cells identified as having the threshold voltage less than at least one of the primary and secondary demarcation threshold voltages in the page read to inhibit conduction currents while identifying the memory cells having the threshold voltage less than a tertiary demarcation threshold voltage of the series. Again, the page read is selected from a group consisting of a lower page read and a middle page read and an upper page read and the series of the plurality of demarcation threshold voltages are based on an encoding scheme of the plurality of memory states.

As discussed above and according to an aspect, the secondary demarcation threshold voltage of the series may be lower than the primary demarcation threshold voltage and the tertiary demarcation threshold voltage of the series may be higher than the secondary demarcation threshold voltage. The primary demarcation threshold voltage can also be selected to minimize an amount of time for the one of the plurality of word lines to ramp down to the primary demarcation threshold voltage from an initial word line voltage (VREAD_SPIKE) being higher than the primary demarcation threshold voltage. In addition, each of the one or more strings is connected to one of a plurality of bit lines of the memory apparatus. So, according to an aspect, the method further includes the step of grounding the one of the plurality of bit lines to inhibit the conduction currents of the one or more strings of the memory cells identified as having the threshold voltage less than the secondary demarcation threshold voltage in the page read thereby reducing an electrical current and power consumed by the memory apparatus during operation.

The method further includes the step of applying a primary read voltage corresponding to the primary demarcation threshold voltage (e.g., VCG_RV corresponding to one of $D_A$, $D_B$, $D_C$, $D_E$, $D_F$, or $D_G$ of FIG. 14) to a selected one of the plurality of word lines while applying a read pass voltage VREAD to unselected ones of the plurality of word lines. The method includes the simultaneous step of sensing the conduction currents of the memory cells of one or more strings to identify the memory cells of the one or more strings having the threshold voltage less than the primary demarcation threshold voltage. Similarly, the method includes the step of applying a secondary read voltage corresponding to the secondary demarcation threshold voltage to the selected one of the plurality of word lines while applying the read pass voltage VREAD to the unselected ones of the plurality of word lines and sensing the conduction currents of the memory cells of the one or more strings to identify the memory cells of the one or more strings having the threshold voltage less than the secondary demarcation threshold voltage. In addition, the method includes the step of applying a tertiary read voltage corresponding to the tertiary demarcation threshold voltage to the selected one of the plurality of word lines while applying the read pass voltage VREAD to the unselected ones of the plurality of word lines and sensing the conduction currents of the memory cells of the one or more strings to identify the memory cells of the one or more strings having the threshold voltage less than the tertiary demarcation threshold voltage.

According to an aspect, the method further includes the step of recording the memory cells of the one or more strings identified as having the threshold voltage less than the secondary demarcation threshold voltage. The method continues by inhibiting the conduction currents of the one or more strings (e.g., by supplying an extremely low or near zero bit line voltage) of the memory cells identified as having the threshold voltage less than the secondary demarcation threshold voltage while identifying the memory cells having the threshold voltage less than the tertiary demarcation threshold voltage of the series.

According to another aspect, the method further includes the step of recording the memory cells of the one or more strings identified as having the threshold voltage less than the primary demarcation threshold voltage as a first group. Next, the method includes the step of recording the memory cells of the one or more strings identified as having the threshold voltage less than the secondary demarcation threshold voltage as a second group. The method proceeds with the step of inhibiting the conduction currents of the one or more strings (e.g., by supplying an extremely low or near zero bit line voltage) of the memory cells in both the first group and the second group while identifying the memory cells having the threshold voltage less than the tertiary demarcation threshold voltage of the series.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top", "bottom", and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptions used herein interpreted accordingly.

What is claimed is:

1. An apparatus, comprising:
   a page of memory cells, each of the memory cells connected to one of a plurality of word lines and arranged in one or more strings and configured to retain a threshold voltage corresponding to one of a plurality of memory states; and
   a control circuit coupled to the plurality of word lines and the one or more strings and configured to perform a read operation to read the memory cells by applying a first sequence of read voltages and a reverse read operation to read the memory cells by applying a second sequence of read voltages different from the first sequence, wherein, to perform the reverse read operation, the control circuit is configured to:
   supply a first bit line voltage to one or more strings and, while supplying the first bit line voltage, identify the memory cells having threshold voltages that are less than a first data state threshold voltage,
   subsequent to identifying the memory cells having threshold voltages that are less than a first data state threshold voltage, supply the first bit line voltage to one or more strings and, while supplying the first bit line voltage, identify the memory cells having threshold voltages that are less than a second data state threshold voltage, the second data state threshold voltage being less than the first data state threshold voltage, and
   subsequent to identifying the memory cells having threshold voltages that are less than the second data state threshold voltage, supply a voltage to inhibit conduction currents of the one or more strings of the memory cells identified as having threshold voltages that are less than the second data state threshold voltage and, while supplying the voltage to inhibit the conduction currents, identify the memory cells having threshold voltages that are less than a third data state threshold voltage, the third data state threshold voltage being less than the first data state threshold voltage and greater than the second data state threshold voltage.

2. The apparatus as set forth in claim 1, wherein each of the one or more strings is connected to one of a plurality of bit lines coupled to the control circuit and the control circuit is further configured to ground the one of the plurality of bit lines to inhibit the conduction currents of the one or more strings of the memory cells identified as having threshold voltages that are less than the second data state threshold voltage thereby reducing an electrical current and power consumed by the apparatus during operation.

3. The apparatus as set forth in claim 1, wherein the control circuit is further configured to:
   apply a primary read voltage corresponding to the first data state threshold voltage to a selected one of the plurality of word lines while applying a read pass voltage to unselected ones of the plurality of word lines and sensing the conduction currents of the memory cells of one or more strings to identify the memory cells of the one or more strings having threshold voltages that are less than the first data state threshold voltage;
   apply a secondary read voltage corresponding to the second data state threshold voltage to the selected one of the plurality of word lines while applying the read pass voltage to the unselected ones of the plurality of word lines and sensing the conduction currents of the memory cells of the one or more strings to identify the memory cells of the one or more strings having threshold voltages that are less than the second data state threshold voltage; and
   apply a tertiary read voltage corresponding to the third data state threshold voltage to the selected one of the plurality of word lines while applying the read pass voltage to the unselected ones of the plurality of word lines and sensing the conduction currents of the memory cells of the one or more strings to identify the memory cells of the one or more strings having threshold voltages that are less than the third data state threshold voltage.

4. The apparatus as set forth in claim 1, wherein the control circuit is further configured to:
   record the memory cells of the one or more strings identified as having threshold voltages that are less than the second data state threshold voltage; and
   inhibit the conduction currents of the one or more strings of the memory cells identified as having threshold voltages that are less than the second data state threshold voltage while identifying the memory cells having threshold voltages that are less than the third data state threshold voltage.

5. The apparatus as set forth in claim 1, wherein the control circuit is further configured to:
   record the memory cells of the one or more strings identified as having threshold voltages that are less than the first data state threshold voltage as a first group;
   record the memory cells of the one or more strings identified as having threshold voltage that are less than the second data state threshold voltage as a second group; and
   inhibit the conduction currents of the one or more strings of the memory cells in both the first group and the second group while identifying the memory cells having threshold voltages that are less than the third data state threshold voltage.

6. The apparatus as set forth in claim 1, wherein the controller is configured to identify the memory cells having threshold read voltages that are less than the first data state threshold voltage, the second data state threshold voltage, and the third data state threshold voltage in a page read that is selected from a group consisting of a lower page read and a middle page read and an upper page read.

7. A controller in communication with a memory apparatus including a page of memory cells, each of the memory cells connected to one of a plurality of word lines and arranged in one or more strings and configured to retain a threshold voltage corresponding to one of a plurality of memory states, the controller configured to perform a read operation to read the memory cells by applying a first sequence of read voltages and a reverse read operation to read the memory cells by applying a second sequence of read voltages different from the first sequence, wherein, to perform the reverse read operation, the control circuit is configured to:

supply a first bit line voltage to one or more strings and, while supplying the first bit line voltage, identify the memory cells having threshold voltages that are less than a first data state threshold voltage, subsequent to identifying the memory cells having threshold voltages that are less than a first data state threshold voltage, supply the first bit line voltage to one or more strings and, while supplying the first bit line voltage, identify the memory cells having threshold voltages that are less than a second data state threshold voltage, the second data state threshold voltage being less than the first data state threshold voltage, and subsequent to identifying the memory cells having threshold voltages that are less than the second data state threshold voltage, supply a voltage to inhibit conduction currents of the one or more strings of the memory cells identified as having threshold voltages that are less than the second data state threshold voltage and, while supplying the voltage to inhibit the conduction currents, identify the memory cells having threshold voltages that are less than a third data state threshold voltage, the third data state threshold voltage being less than the first data state threshold voltage and greater than the second data state threshold voltage.

8. The controller as set forth in claim 7, wherein the controller is further configured to:

instruct the memory apparatus to apply a primary read voltage corresponding to the first data state threshold voltage to a selected one of the plurality of word lines while instructing the memory apparatus to apply a read pass voltage to unselected ones of the plurality of word lines and instructing the memory apparatus to sense the conduction currents of the memory cells of one or more strings to identify the memory cells of the one or more strings having threshold voltages that are less than the first data state threshold voltage;

instruct the memory apparatus to apply a secondary read voltage corresponding to the second data state threshold voltage to the selected one of the plurality of word lines while instructing the memory apparatus to apply the read pass voltage to the unselected ones of the plurality of word lines and instructing the memory apparatus to sense the conduction currents of the memory cells of the one or more strings to identify the memory cells of the one or more strings having threshold voltages that are less than the second data state threshold voltage; and instruct the memory apparatus to apply a tertiary read voltage corresponding to the third data state threshold voltage to the selected one of the plurality of word lines while instructing the memory apparatus to apply the read pass voltage to the unselected ones of the plurality of word lines and instructing the memory apparatus to sense the conduction currents of the memory cells of the one or more strings to identify the memory cells of the one or more strings having threshold voltages that are less than the third data state threshold voltage.

9. The controller as set forth in claim 7, wherein the controller is further configured to:

record the memory cells of the one or more strings identified as having threshold voltages that are less than the second data state threshold voltage; and instruct the memory apparatus to inhibit the conduction currents of the one or more strings of the memory cells identified as having threshold voltages that are less than the second data state threshold voltage while identifying the memory cells having threshold voltages that are less than the third data state threshold voltage.

10. The controller as set forth in claim 7, wherein the controller is further configured to:

record the memory cells of the one or more strings identified as having threshold voltages that are less than the first data state threshold voltage as a first group;

record the memory cells of the one or more strings identified as having threshold voltages that are less than the second data state threshold voltage as a second group; and instruct the memory apparatus to inhibit the conduction currents of the one or more strings of the memory cells in both the first group and the second group while identifying the memory cells having threshold voltages that are less than the third data state threshold voltage.

11. The controller as set forth in claim 7, wherein the controller is configured to identify the memory cells having threshold read voltages that are less than the first data state threshold voltage, the second data state threshold voltage, and the third data state threshold voltage in a page read that is selected from a group consisting of a lower page read and a middle page read and an upper page read.

12. A method of operating a memory apparatus including a page of memory cells, each of the memory cells connected to one of a plurality of word lines and arranged in one or more strings and configured to retain a threshold voltage corresponding to one of a plurality of memory states, the method comprising the steps of performing a read operation to read the memory cells by applying a first sequence of read voltages and performing a reverse read operation to read the memory cells by applying a second sequence of read voltages different from the first sequence, wherein the method further comprises, to perform the reverse read operation:

supplying a first bit line voltage to one or more strings and, while supplying the first bit line voltage, identifying the memory cells having threshold voltages that are less than a first data state threshold voltage;

subsequent to identifying the memory cells having threshold voltages that are less than the first data state threshold voltage, supplying the first bit line voltage to one or more strings and, while supplying the first bit line voltage, identifying the memory cells having the threshold voltage less than a second data state threshold voltage; and subsequent to identifying the memory cells having threshold voltages that are less than the second data state threshold voltage, supplying a second voltage to inhibit conduction currents of the one or more strings of the memory cells identified as having threshold voltages that are less than the second data state threshold voltage and, while supplying the voltage to inhibit the conduction currents, identifying the memory cells that have threshold voltages that are less than a third data state threshold voltage, the third data state threshold voltage being less than the first data state threshold voltage and greater than the second data state threshold voltage.

13. The method as set forth in claim 12, wherein each of the one or more strings is connected to one of a plurality of bit lines of the memory apparatus and the method further includes the step of grounding the one of the plurality of bit lines to inhibit the conduction currents of the one or more strings of the memory cells identified as having threshold voltages that are less than the second data state threshold voltage to reduce an electrical current and power consumed by the memory apparatus during operation.

14. The method as set forth in claim 12, wherein the method further includes the steps of:
   applying a primary read voltage corresponding to the first data state threshold voltage to a selected one of the plurality of word lines while applying a read pass voltage to unselected ones of the plurality of word lines and sensing the conduction currents of the memory cells of one or more strings to identify the memory cells of the one or more strings having threshold voltages that are less than the first data state threshold voltage;
   applying a secondary read voltage corresponding to the second data state threshold voltage to the selected one of the plurality of word lines while applying the read pass voltage to the unselected ones of the plurality of word lines and sensing the conduction currents of the memory cells of the one or more strings to identify the memory cells of the one or more strings having threshold voltages that are less than the second data state threshold voltage; and
   applying a tertiary read voltage corresponding to the third data state threshold voltage to the selected one of the plurality of word lines while applying the read pass voltage to the unselected ones of the plurality of word lines and sensing the conduction currents of the memory cells of the one or more strings to identify the memory cells of the one or more strings having threshold voltages that are less than the third data state threshold voltage.

15. The method as set forth in claim 12, wherein the method further includes the steps of:
   recording the memory cells of the one or more strings identified as having threshold voltage less than the secondary demarcation threshold voltage; and
   inhibiting the conduction currents of the one or more strings of the memory cells identified as having threshold voltages that are less than the second data state threshold voltage while identifying the memory cells having threshold voltages that are less than the third data state threshold voltage.

16. The method as set forth in claim 12, wherein the method further includes the steps of:
   recording the memory cells of the one or more strings identified as having threshold voltages that are less than the first data state threshold voltage as a first group;
   recording the memory cells of the one or more strings identified as having threshold voltages that are less than the second data state threshold voltage as a second group; and
   inhibiting the conduction currents of the one or more strings of the memory cells in both the first group and the second group while identifying the memory cells having threshold voltages that are less than the third data state threshold voltage.

17. The method as set forth in claim 12, wherein the steps of identifying the memory cells that have threshold voltages that are less than the first data state threshold voltage and the second data state threshold voltage and the third data state threshold voltage are performed during a page read that is selected from a group consisting of a lower page read and a middle page read and an upper page read.

* * * * *